US012507408B2

(12) United States Patent
Chae et al.

(10) Patent No.: US 12,507,408 B2
(45) Date of Patent: Dec. 23, 2025

(54) METHOD AND STRUCTURES TO REDUCE RESISTIVITY IN THREE-DIMENSIONAL STRUCTURES FOR MICROELECTRONIC WORKPIECES USING MATERIAL DEPOSITED IN RECESSES AT EDGES OF HOLES IN A MULTILAYER STACK

(71) Applicant: Tokyo Electron Limited, Tokyo (JP)

(72) Inventors: Soo Doo Chae, Albany, NY (US); Sang Cheol Han, Albany, NY (US); Youngwoo Park, Hwaseong-si (KR)

(73) Assignee: Tokyo Electron Limited, Tokyo (JP)

( * ) Notice: Subject to any disclaimer, the term of this patent is extended or adjusted under 35 U.S.C. 154(b) by 287 days.

(21) Appl. No.: 17/197,144

(22) Filed: Mar. 10, 2021

(65) Prior Publication Data

US 2021/0288069 A1 Sep. 16, 2021

Related U.S. Application Data

(60) Provisional application No. 62/988,716, filed on Mar. 12, 2020.

(51) Int. Cl.
*H10B 43/27* (2023.01)

(52) U.S. Cl.
CPC .................. *H10B 43/27* (2023.02)

(58) Field of Classification Search
CPC ........................................ H10B 43/27
See application file for complete search history.

(56) References Cited

U.S. PATENT DOCUMENTS

| | | | |
|---|---|---|---|
| 9,142,563 B2* | 9/2015 | Chang | H10B 41/27 |
| 9,230,974 B1 | 1/2016 | Pachamuthu et al. | |
| 9,349,745 B2 | 5/2016 | Lue | |
| 9,379,124 B2 | 6/2016 | Sharangpani et al. | |
| 9,449,981 B2 | 9/2016 | Pachamuthu et al. | |
| 10,340,143 B1 | 7/2019 | Liu et al. | |
| 2009/0134469 A1* | 5/2009 | Chang | H01L 21/28097 257/369 |
| 2009/0315093 A1 | 12/2009 | Li et al. | |
| 2011/0031586 A1* | 2/2011 | Kang | H01L 28/40 257/532 |
| 2013/0256828 A1* | 10/2013 | Lee | H10B 12/48 257/506 |
| 2014/0203344 A1* | 7/2014 | Hopkins | H01L 29/42324 438/589 |
| 2015/0214241 A1* | 7/2015 | Lee | H10B 43/27 257/314 |
| 2015/0357413 A1* | 12/2015 | Zhang | H10B 43/27 257/324 |
| 2016/0111434 A1* | 4/2016 | Pachamuthu | H01L 21/02244 257/314 |
| 2016/0343580 A1 | 11/2016 | Hudson | |
| 2018/0019256 A1* | 1/2018 | Amano | H01L 21/76879 |

(Continued)

*Primary Examiner* — Norman D Richards
*Assistant Examiner* — Sean Ayers Winters
(74) *Attorney, Agent, or Firm* — Slater Matsil, LLP

(57) ABSTRACT

In certain embodiments, a 3D structure for a microelectronic workpiece includes a multilayer stack that includes polysilicon layers separated by other layers, holes formed within the multilayer stack, recesses formed within the polysilicon layers at edges of the holes, conductive material deposited within the recesses to form outer layers within the holes, and plugs formed adjacent the outer layers within the holes.

20 Claims, 18 Drawing Sheets

(56) References Cited

U.S. PATENT DOCUMENTS

| | | | |
|---|---|---|---|
| 2018/0233513 A1* | 8/2018 | Zhang | .................... G11C 16/26 |
| 2019/0245086 A1* | 8/2019 | Heiman | .............. H01L 29/7841 |
| 2020/0118871 A1 | 4/2020 | Yu et al. | |

* cited by examiner

METHOD AND STRUCTURES TO REDUCE RESISTIVITY IN THREE-DIMENSIONAL STRUCTURES FOR MICROELECTRONIC WORKPIECES USING MATERIAL DEPOSITED IN RECESSES AT EDGES OF HOLES IN A MULTILAYER STACK

CROSS-REFERENCE TO RELATED APPLICATIONS

This application claims the benefit of U.S. Provisional Application No. 62/988,716, filed on Mar. 12, 2020, which is incorporated by reference.

TECHNICAL FIELD

This disclosure relates generally to manufacturing microelectronic workpieces, and, in certain embodiments, to three-dimensional (3D) structures for microelectronic workpieces.

BACKGROUND

Device formation within microelectronic workpieces typically involves a series of manufacturing techniques related to the formation, patterning, and removal of layers of material on a substrate. To meet the physical and electrical specifications of current and next generation semiconductor devices, process flows are being requested to reduce feature size while maintaining structure integrity for various patterning processes.

3D structures are becoming common formations on microelectronic workpieces to increase device density. Examples of such 3D structures for microelectronic workpieces include fin field-effect transistors (FINFETs), 3D memory structures, and/or other 3D structures. As the density requirements increase, however, improvements are needed to reduce production costs and to maintain device integrity and performance in 3D structures such as 3D memory structures.

SUMMARY

In certain embodiments, a method to form 3D structures for a microelectronic workpiece includes forming holes within a multilayer stack that includes polysilicon layers separated by other layers, forming recesses within the polysilicon layers at edges of the holes, depositing a conductive material within the recesses to form outer layers within the holes, and forming plugs adjacent to the outer layers within the holes.

In certain embodiments, the multilayer stack includes alternating oxide layers and polysilicon layers. In certain embodiments, the multilayer stack is formed over one or more additional layers formed on a substrate. In certain embodiments, the conductive material formed within the recesses includes titanium nitride (TiN). In certain embodiments, the conductive material formed within the recesses includes at least one of titanium silicon nitride (TiSiN), tantalum nitride (TaN), aluminum-doped titanium carbide (TiAlC), titanium oxynitride (TiON), titanium carbon nitride (TiCN), or titanium aluminum nitride (TiAlN).

In certain embodiments, the holes include channel holes for 3D memory cells, and the polysilicon layers and the conductive material within the recesses are used to provide gates for the 3D memory cells. For example, the 3D memory cells may include vertical NAND memory cells.

In certain embodiments, the plugs include multiple material layers. In certain embodiments, the holes include channel holes for 3D memory cells, and the multiple material layers for the plugs include silicon layers used as channels for the 3D memory cells. As just a few examples, the multiple material layers for the plugs may include aluminum oxide (AlO, or $Al_2O_3$) layers, silicon nitride (SiN, a particular example of which is $Si_3N_4$) layers, oxide layers, and silicon layers.

In certain embodiments, forming the recesses includes performing one or more wet etch processes, plasma etch processes, reactive ion etch (RIE) processes, or combinations of these or other etch processes. In certain embodiments, depositing the conductive material within the recesses includes performing one or more atomic layer deposition (ALD) processes, chemical vapor deposition (CVD) processes, plasma deposition processes, or combinations of these or other deposition processes.

In certain embodiments, a target level of resistivity is achieved across the structures by depositing the conductive material within the recesses formed in the polysilicon layers.

In certain embodiments, a 3D structure for a microelectronic workpiece includes a multilayer stack that includes polysilicon layers separated by other layers, holes formed within the multilayer stack, recesses formed within the polysilicon layers at edges of the holes, conductive material deposited within the recesses to form outer layers within the holes, and plugs formed adjacent the outer layers within the holes.

In certain embodiments, the multilayer stack includes alternating oxide layers and polysilicon layers. In certain embodiments, the conductive material formed within the recesses includes TiN. In certain embodiments, the conductive material formed within the recesses includes at least one of TiSiN, TaN, TiAlC, TiON, TiCN, or TiAlN.

In certain embodiments, the holes include channel holes for 3D memory cells, and the polysilicon layers and the conductive material within the recesses are used to provide gates for the 3D memory cells. For example, the 3D memory cells may include vertical NAND memory cells.

In certain embodiments, the holes include channel holes for 3D memory cells. In certain embodiments, the plugs include multiple material layers, and the multiple material layers for the plugs include silicon layers used as channels for the 3D memory cells.

In certain embodiments, a 3D structure for a microelectronic workpiece includes a multilayer stack. The multilayer stack includes polysilicon layers and insulating layers in an alternating stacked arrangement. The 3D structure further includes channel holes for 3D memory cells, the channel holes being formed within the multilayer stack. The 3D structure further includes outer layers formed within the channel holes. The outer layers include fill material deposited within recesses that are formed within the polysilicon layers at the edges of the holes. The fill material has a lower resistivity than the polysilicon layers. The polysilicon layers and the fill material within the recesses are configured to provide gates for the 3D memory cells. The 3D structure further includes plugs formed adjacent the outer layers within the holes, the plugs including multiple material layers. The multiple material layers for the plugs include silicon layers configured to provide channels for the 3D memory cells.

In certain embodiments, the insulating layers are oxide layers such that the multilayer stack is an oxide-polysilicon-oxide-polysilicon (OPOP) stack.

In certain embodiments, the fill material formed within the recesses includes TiN. In certain embodiments, the fill material formed within the recesses includes at least one of TiSiN, TaN, TiAlC, TiON, TiCN, or TiAlN.

In certain embodiments, the multiple material layers for the plugs include a dielectric layer that includes a low-k dielectric material.

In certain embodiments, the 3D memory cells include vertical NAND memory cells.

Different or additional features, variations, and embodiments also can be implemented, and related systems and methods can be used as well.

BRIEF DESCRIPTION OF THE DRAWINGS

For a more complete understanding of this disclosure, and advantages thereof, reference is made to the following descriptions taken in conjunction with the accompanying drawings, in which.

DETAILED DESCRIPTION OF ILLUSTRATIVE EMBODIMENTS

To increase density and lower cost-per-bit for memory devices, 3D memory structures have been formed using current processes. For example, vertical NAND (VNAND) memory cells have been developed using 3D stacked structures. As higher stacks have been implemented, manufacturing costs have increased. As a particular example, stacked structures of alternating oxide (e.g., silicon dioxide, or $SiO_2$) and polysilicon layers have been used to reduce costs as compared to other multilayer stacked structures. These oxide-polysilicon-oxide-polysilicon (OPOP) structures can be stacked to desired heights and are formed using a reduced number of process steps as compared to certain other multilayer stacked structures. However, the high resistivity of the polysilicon layers in the OPOP structures has degraded memory performance.

Figure 1:
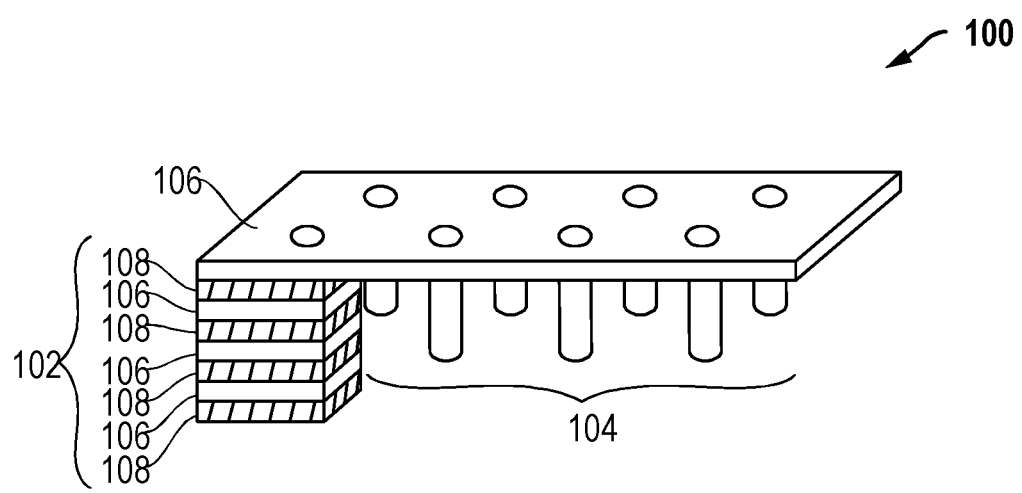
FIG. 1 (Prior Art) illustrates a perspective view of an example embodiment for a 3D structure including a multilayer stack.

FIG. 1 (Prior Art) illustrates a perspective view 100 of an example embodiment for a 3D structure including a multilayer stack 102. Multilayer stack 102 may include alternating polysilicon layers 106 and oxide layers 108, making multilayer stack 102 an OPOP stack. Although multilayer stack 102 is primarily described as including alternating polysilicon layers 106 and oxide layers 108, multilayer stack 102 may include other alternating conductive and insulating layers. Additionally, although multilayer stack 102 is shown to include a particular number of layers, multilayer stack 102 may include any suitable number of layers, according to particular implementation goals.

In certain embodiments, single crystal or large grain polycrystalline semiconductor material formed by a metal-induced crystallization process may be used for polysilicon layers 106. Oxide layers 108 may include any suitable oxide material, such as silicon oxide (e.g., $SiO_2$), or silicon oxynitride for example.

Only a portion of multilayer stack 102 is shown, with other portions having been removed to reveal holes 104 formed within multilayer stack 102. It is understood that multilayer stack 102 continues underneath the top polysilicon layer 106. It also is understood that multilayer stack 102 can be formed over one or more other material layers on a substrate for a microelectronic workpiece. Although shown to be generally a circular cylinder as they extend through multilayer stack 102, holes 104 may have any suitable shape.

Holes 104 may be channel holes in which a channel for a semiconductor device, such as a 3D semiconductor device, may be formed. In certain embodiments, holes 104 within multilayer stack 102 can be used to form 3D memory cells, with channels for the 3D memory cells being formed in holes 104. For example, vertical NAND memory cells may be manufactured using holes 104 formed in an OPOP stack, such as multilayer stack 102. Further, single-level cell (SLC) memories, multi-level cell (MLC) memories such as triple-level cell (TLC) and quad-level cell (QTC) memories, and/or other memory or device structures can be formed using these techniques.

Figure 2:
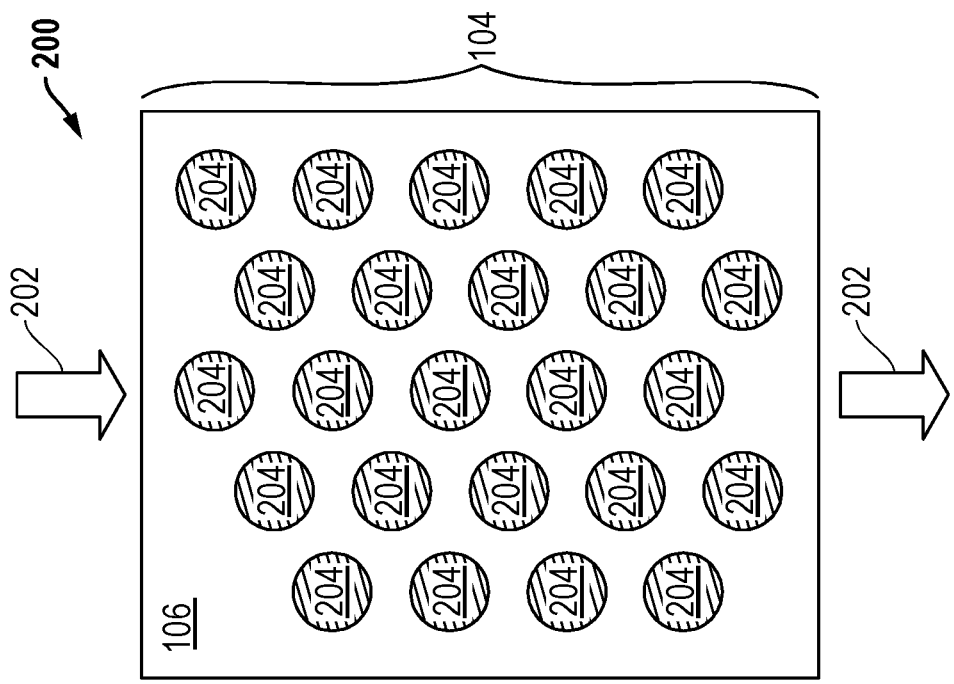
FIG. 2 (Prior Art) illustrates a top view of an example embodiment for the 3D structures of FIG. 1.

FIG. 2 (Prior Art) illustrates a top view 200 of an example embodiment for the 3D structures of FIG. 1. Holes 104 are distributed across the top polysilicon layer 106 and extend into multilayer stack 102 as shown in FIG. 1. In the illustrated example, each hole 104 is filled with a plug 204. For prior solutions, plug 204 is typically implemented as multiple material layers that include silicon, oxide, SiN, oxide, and silicon (e.g., SONOS structures). Unfortunately, as described above, the relatively high resistivity of polysilicon layers 106 in multilayer stack 102, as represented by arrow 202, may degrade memory performance as compared to prior traditional two-dimensional memory solutions and other 3D memory solutions using more complicated and costly multilayer stacks.

Certain embodiments of this disclosure provide methods and structures to reduce resistivity in 3D structures for microelectronic workpieces. For example, embodiments of the disclosed techniques can be used to reduce resistivity of polysilicon gates in 3D memory cells. In certain embodiments, holes are formed within a multilayer stack including polysilicon layers separated by other layers. Recesses are formed within the polysilicon layers at edges of the holes, and a conductive material is deposited within the recesses to form outer layers within the holes. The conductive material may be one or more low-resistivity conductive materials. Plugs are then formed adjacent to the outer layers within the holes. In certain embodiments, resistivity is reduced as compared to prior solutions by depositing the conductive material within the recesses formed in the polysilicon layers.

In certain embodiments, the multilayer stack, holes, outer layers, and plugs may form structures for 3D memory cells. For example, the holes formed within the multilayer stack may be channel holes, and the polysilicon layers and conductive material forming the outer layers can be used to provide gates for 3D memory cells. Resulting outer layers in channel holes for vertical memory structures thereby may reduce the amount of higher-resistivity polysilicon between the channel holes. As such, these outer layers may reduce resistivity across the memory structures as compared to prior solutions.

Different or additional features, variations, and embodiments also can be implemented, and related systems and methods can be used as well. Other advantages and implementations can also be achieved while still taking advantage of the structures and process techniques described herein.

Figure 3:
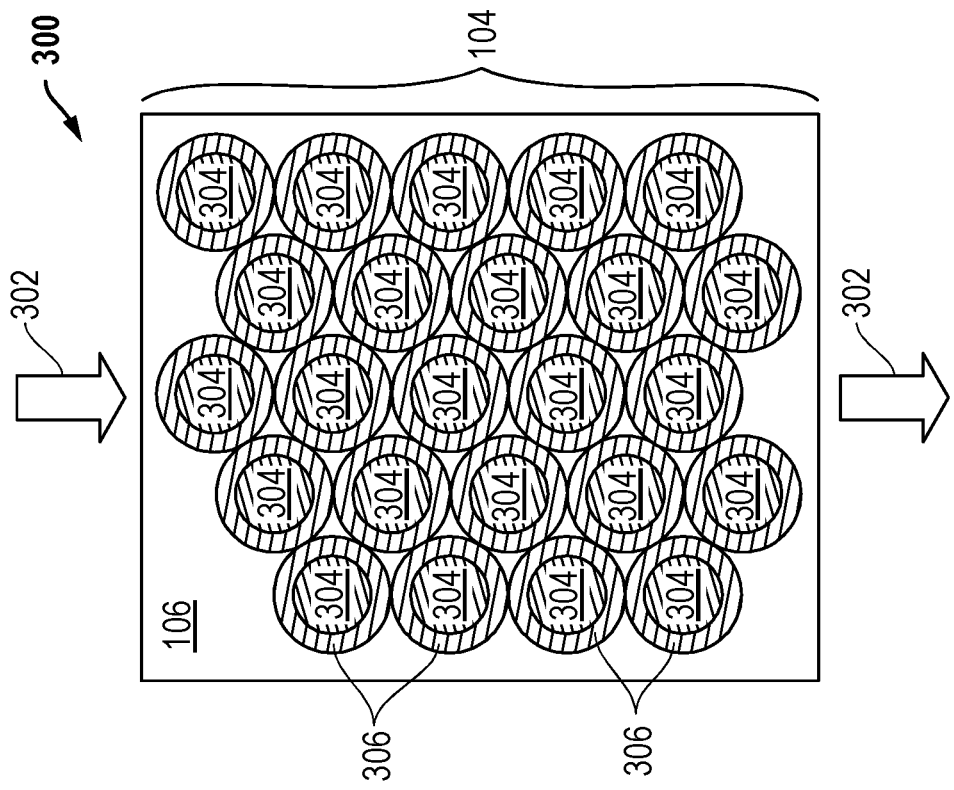
FIG. 3 illustrates a top view of an example embodiment for structures according to certain disclosed techniques that are formed within a multilayer stack, such as multilayer stack 102 shown in FIG. 1.

FIG. 3 illustrates a top view 300 of an example embodiment for structures according to certain disclosed techniques that are formed within a multilayer stack, such as multilayer stack 102 shown in FIG. 1.

In the illustrated example, holes 104 are distributed across the surface of the top polysilicon layer 106 and extend into the multilayer stack 102 as shown in FIG. 1. Although in this example, the top layer of multilayer stack 102 is shown to be a polysilicon layer 106, this disclosure contemplates the top layer of multilayer stack 102 being another layer, such as an oxide layer 108 or a layer of another material.

In contrast to the prior solution shown in FIG. 2, outer layers 306 in each hole 104 may be formed using a low-resistivity conductive material. As described in greater detail below, outer layers 306 may be formed by removing a portion of one or more of polysilicon layers 106 at the edges of holes 104 to form recesses at the edges of holes 104 and then filling those recesses with the low-resistivity conductive material.

The conductive material can be, for example, TiN. Other materials including titanium, TiSiN, TaN, TiAlC, TiON, TiCN, TiAlN, or other conductive materials or combinations of materials can also be used. In certain embodiments, the conductive material has a resistivity lower than the resistivity for polysilicon. By forming the outer layers 306 in each hole 104, a target level of resistivity is achieved across the structures by depositing the conductive material within recesses formed in the polysilicon layers as described in more detail below.

The remainder of each hole 104 may be filled with a plug 304. Plugs 304 may be implemented using one or more material layers. In certain embodiments, plugs 304 are implemented using multiple material layers. For example, plugs 304 may include layers of AlO, SiN, oxide, and silicon. Additional and/or different material layers can also be used for plugs 304 while still taking advantage of the low-resistivity outer layer 306 to reduce resistivity in the 3D structures as represented by arrow 302. In certain embodiments, holes 104 are channel holes used to form 3D memory cells or other 3D structures, and the reduced resistivity achieved by forming the outer layer 306 within polysilicon layers of the multilayer stack 102 improves memory performance as compared to the prior solutions described above.

The structure illustrated in FIG. 3 is simplified to illustrate the concept of outer layers 306 of holes 104 that are filled with the conductive material. Additional details of how outer layers 306 may be implemented in a structure are shown and described with respect to FIGS. 4A-4D, 5, and 7A-7K.

FIGS. 4A-4D illustrate cross-sectional views 400, 420, 430, and 440 of an example embodiment to form 3D structures that include holes 104 having a low-resistivity outer layer 306 and a plug 304 as shown in FIG. 3 and described herein. Each of FIGS. 4A-4D is described in greater detail below.

Figure 4A:
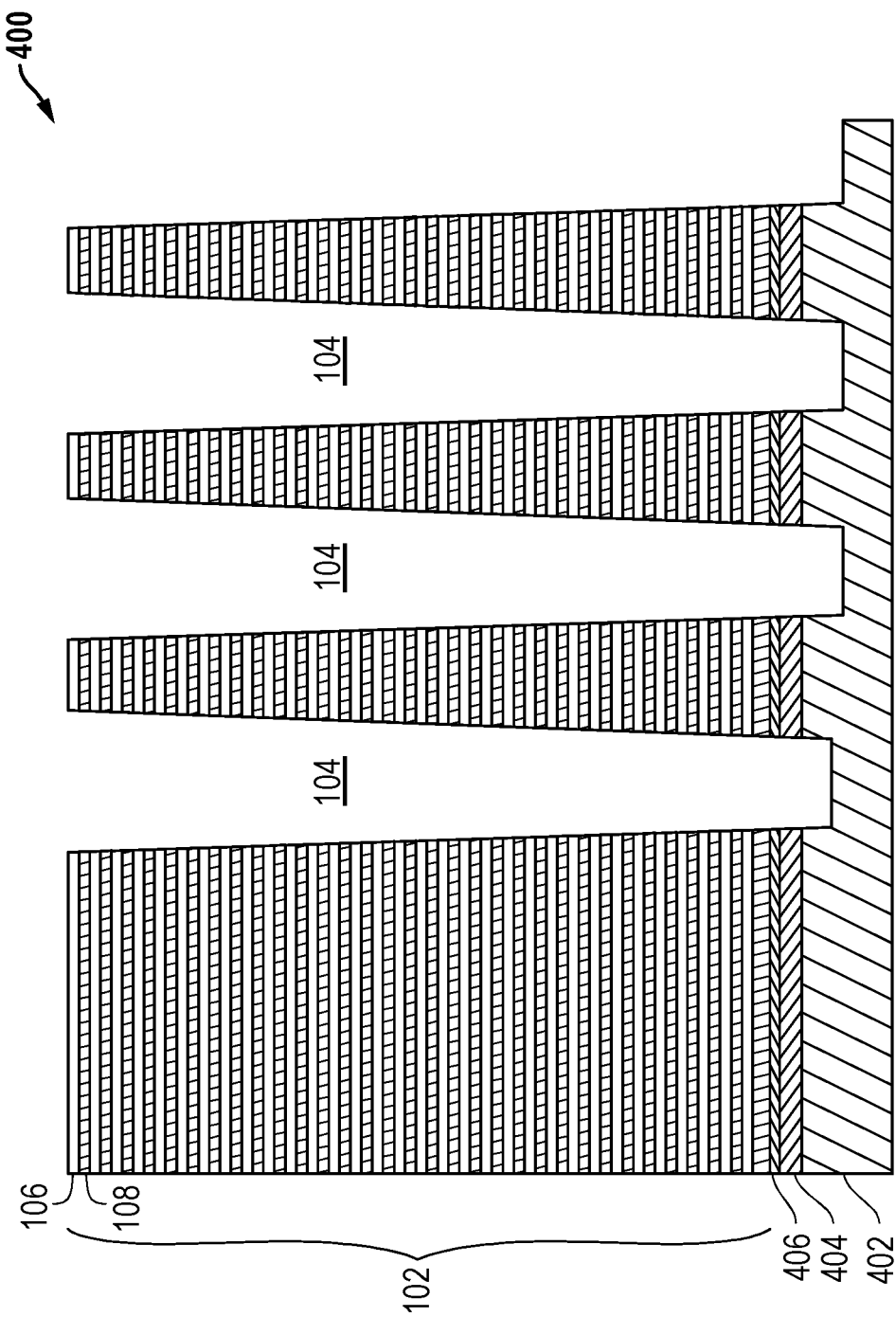
FIGS. 4A-4D illustrate cross-sectional views of an example embodiment to form 3D structures that include holes having a low-resistivity outer layer and a plug as shown in FIG. 3 and described herein.

FIG. 4A illustrates a cross-sectional view 400 of an example multilayer structure after one or more etch processes have been performed to form holes 104 within multilayer stack 102. Multilayer stack 102 includes alternating polysilicon layers 106 and oxide layers 108. Multilayer stack 102 can be formed over one or more additional layers. For example, multilayer stack 102 can be formed over layers 402, 404, and 406. As a particular example, layer 406 can be an N-doped polysilicon layer or another conductive material; layer 404 can be AlO, SiN, or another etch-stop material; and layer 402 can be a semiconductor substrate such as a silicon substrate. Multilayer stack 102 can be formed over different and/or additional layers, if appropriate.

The etch processes for forming holes 104 within multilayer stack 102 can include one or more wet etch processes, plasma etch processes, RIE processes, and/or other etch processes or combinations of etch processes. Additional details regarding an example etch process that may be used to form holes 104 are described below with reference to FIGS. 7A-7B.

Although the multilayer structure illustrated in FIGS. 4A-4D is shown to have a particular number of layers, this disclosure contemplates a multilayer structure having any suitable number of layers. For example, multilayer stack 102 may include more or fewer layers than are shown, if desired.

Figure 4B:
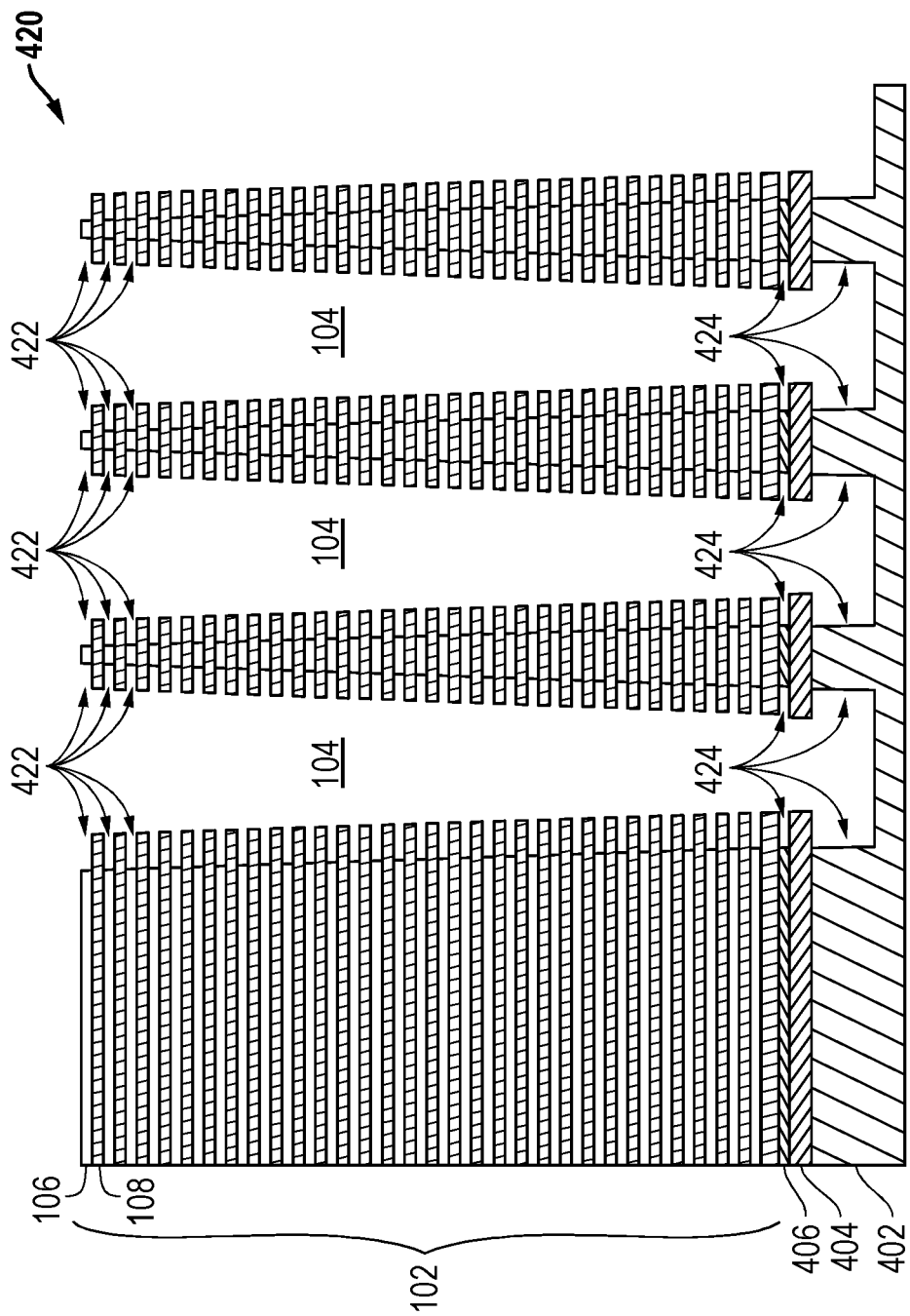

FIG. 4B illustrates a cross-sectional view 420 of an example multilayer structure after one or more etch processes have been performed on the structures in FIG. 4A to form recesses 422 within the polysilicon layers 106 at edges of the holes 104 within the multilayer stack 102. In the illustrated example, the one or more etch processes also form recesses 424 in layers 402 and 406. The etch processes can include one or more wet etch processes, plasma etch processes, RIE etch processes, and/or other etch processes or combinations of etch processes. Additional details regarding an example etch process that may be used to form recesses 422 and/or 424 are described below with reference to FIG. 7C.

Although recesses 422 are shown as having particular depths within polysilicon layers 106, recesses 422 may have any suitable depths within polysilicon layers 106. Furthermore, recesses 422 may have the same depths or may vary in depth, as desired.

Figure 4C:
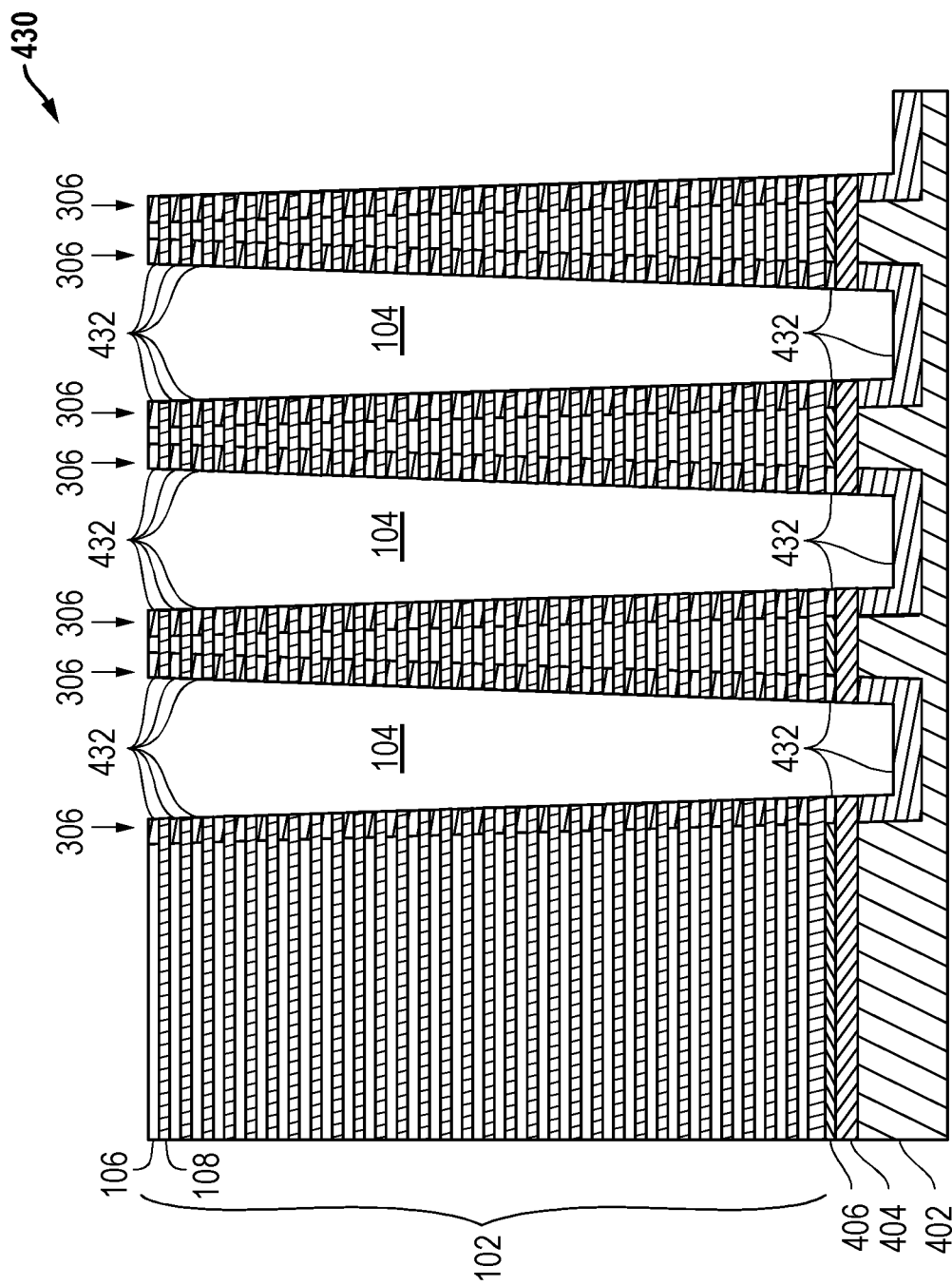

FIG. 4C illustrates a cross-sectional view 430 of an example multilayer structure after one or more deposition processes have been performed to deposit conductive material 432 within the recesses 422 shown in FIG. 4B. The conductive material 432 can also be formed within recesses 424 shown in FIG. 4B. As described herein, the conductive material 432 provides outer layers 306 within the holes 104.

As described above, the conductive material can be, for example, titanium-nitride (TiN), although other titanium, TiSiN, TaN, TiAlC, TiON, TiCN, TiAlN, other titanium containing materials, or other conductive materials or combinations of materials can also be used.

The deposition processes can include one or more ALD processes, CVD processes, plasma deposition processes, and/or other layer deposition processes or combinations of processes. Additional details regarding an example deposition process and/or etch process that may be used to form conductive material 432 in recesses 422 and/or 424 are described below with reference to FIGS. 7D-7E.

Figure 4D:
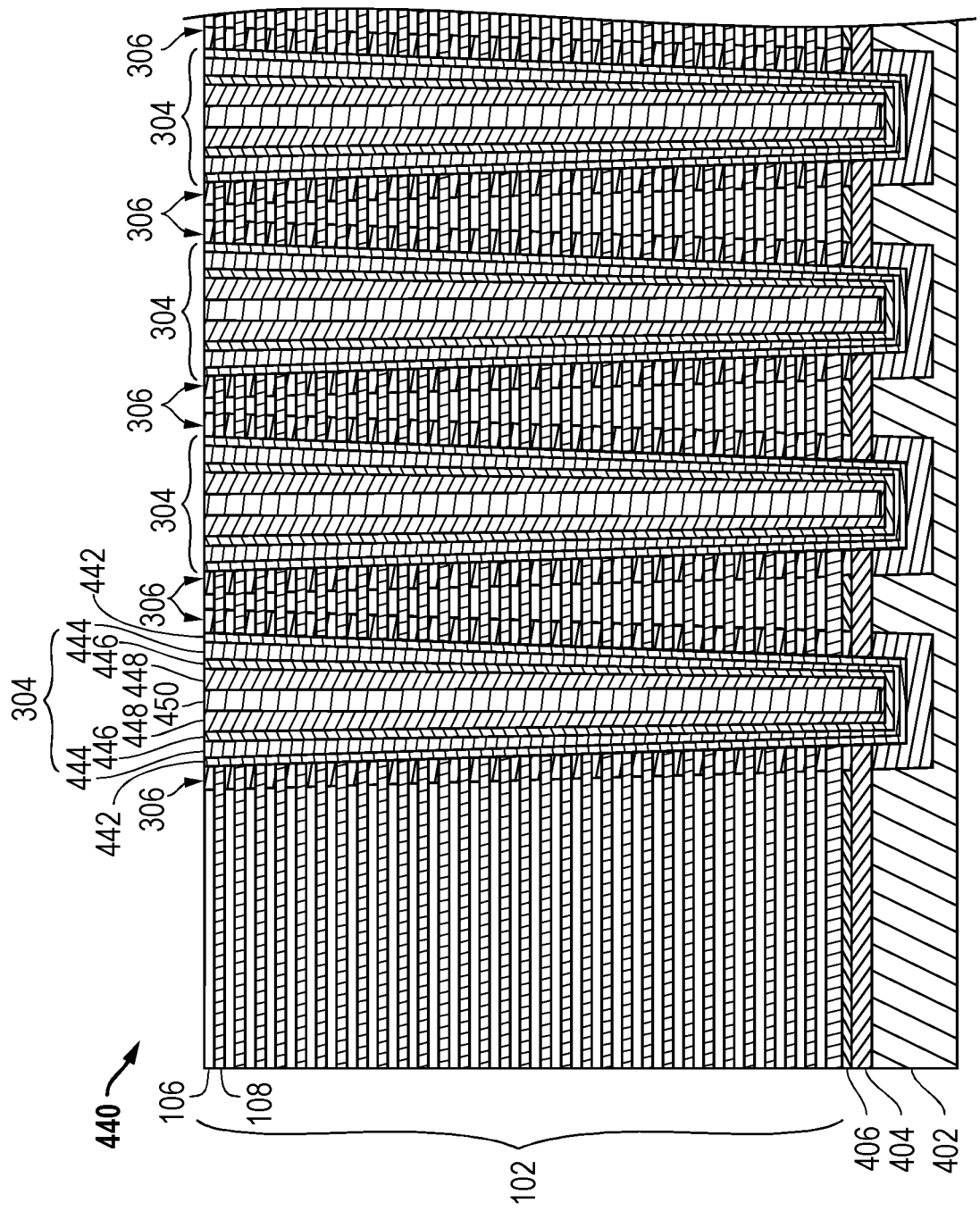

FIG. 4D illustrates a cross-sectional view 440 of an example multilayer structure after one or more processes have been performed to form plugs 304 adjacent the low-resistivity outer layers 306 within holes 104 shown in FIG. 4C. As described above, plugs 304 can be implemented with different combinations of material layers. In the example illustrated in FIG. 4D, material layers 442, 444, 446, 448, and 450 are used to form plugs 304. As a particular example, material layer 442 may be AlO, hafnium oxide ($HfO_2$), or $SiO_2$; material layer 444 may be SiN; material layer 446 may be oxide; material layer 448 may be silicon; and material layer 450 may be oxide. Other multilayer structures can also be used for plugs 304.

The processes for forming plugs 304 may include any suitable combination of deposition processes and etch processes. The deposition processes can include one or more ALD processes, CVD processes, plasma deposition processes, and/or other layer deposition processes or combinations of processes. The etch processes, to the extent used, can include one or more wet etch processes, plasma etch processes, RIE processes, and/or other etch processes or combinations of etch processes. Additional details regarding an example process that may be used to form plugs 304 are described below with reference to FIGS. 7F-7K.

A silicon material layer, such as material layer 448, could be used as a channel within 3D memory cells such as 3D vertical NAND memory cells. Polysilicon layers 106 within the multilayer stack 102, as shown in FIGS. 4A-4D, can be used to provide gates within 3D memory cells, such as 3D vertical NAND memory cells. The low-resistivity outer layer 306, which is formed by depositing conductive material 432 within recesses 422 as shown in FIG. 4C, reduces the resistivity of these gates thereby improving memory performance.

In certain embodiments, a portion of layers 442, 444, and 446 may be removed, via one or more etch processes for example, to allow contact to be made between layer 448 (e.g., which may act as a channel region) and conductive material 432 at the bottom of holes 104, and ultimately to a source or drain line. Depending on the technique used, this removal process may be performed prior to or after deposition of layer 448. An example of such a process is illustrated in and described below with reference to FIG. 7I. Additionally or alternatively, layer 404 may be removed and refilled with a conductive material such as doped silicon or a metal. In such an example, portions of layers 442, 444, and 446 may be removed so that contact can be made between layer 406 and layer 448.

3D memory structures are just one example of 3D structures formed on microelectronic workpieces that can take advantage of the techniques described herein. The techniques described herein can be used with other structures, including other 3D structures in addition to 3D memory cell structures where holes (e.g., holes 104) are formed through multilayer stacks. Furthermore, while alternating polysilicon layers 106 and oxide layers 108 are described herein for multilayer stacks 102 shown in the example embodiments of FIGS. 4A-4D (and in other figures), other insulating materials and conductive materials could also be used for the alternating layers within the multilayer stacks. More generally, therefore, the multilayer stacks described herein can include alternating insulating layers and conductive layers of other materials in addition to and/or instead of oxide and polysilicon materials, while still taking advantage of the techniques described herein.

Figure 5:
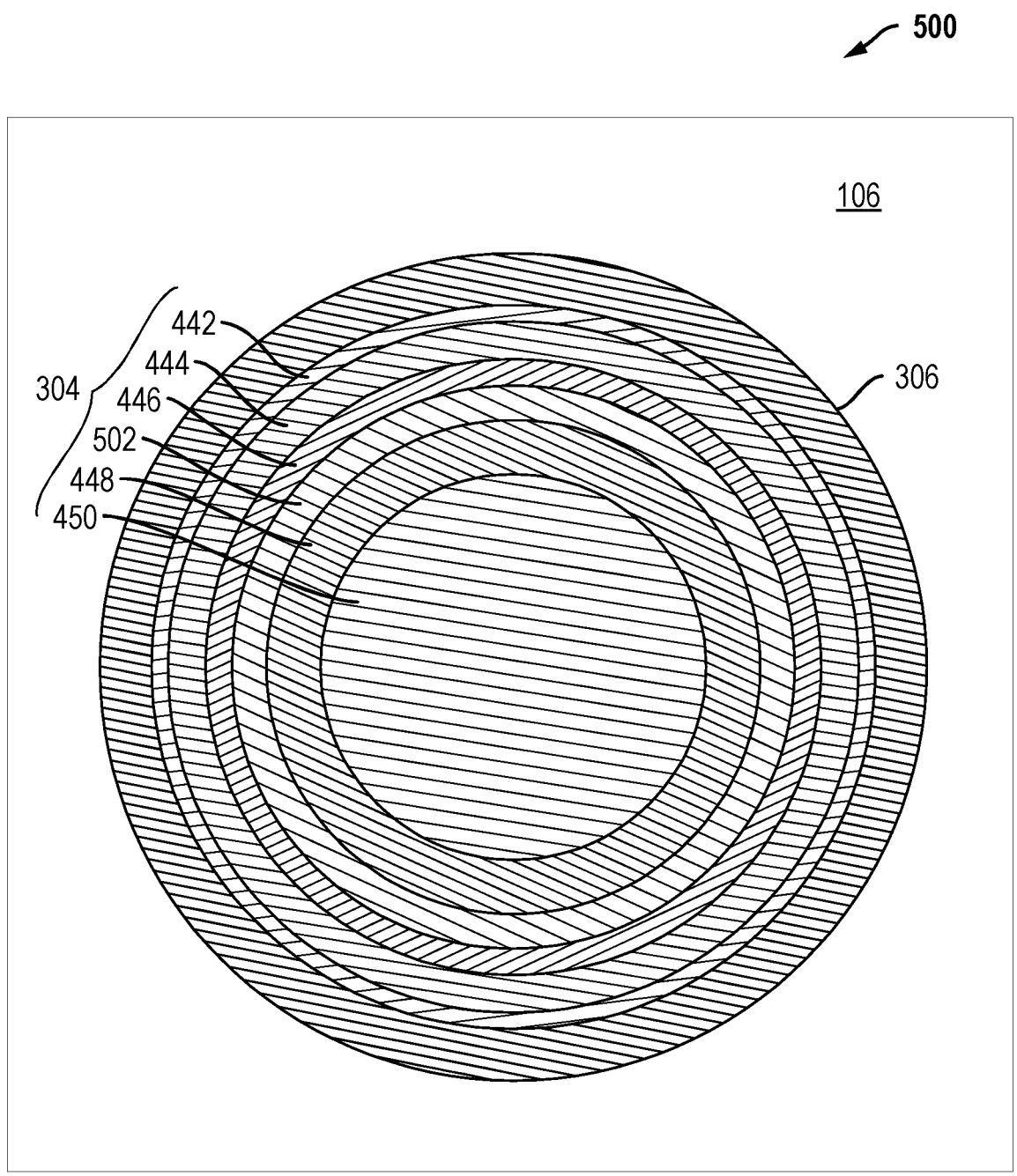
FIG. 5 illustrates a top view of an example embodiment of a hole formed in a multilayer structure, the hole includes a low-resistivity outer layer and an adjacent plug.
Figure 5:
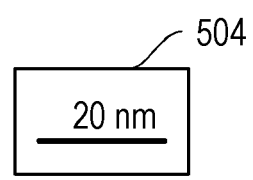

FIG. 5 illustrates a top view 500 of an example embodiment of a hole 104 formed in a multilayer structure, hole 104 including a low-resistivity outer layer 306 and an adjacent plug 304. Dimensions shown are relative to the 20 nanometer (nm) bar included in box 504. It should be understood that the illustrated dimensions are provided for example purposes only; this disclosure contemplates forming a structure having any suitable dimensions. In the illustrated example, top view 500 shows hole 104 formed in the top polysilicon layer 106; however, the top layer of multilayer stack 102 could be another layer, if appropriate.

In the illustrated example of FIG. 5, the layers for this multilayer structure, including plug 304 and outer layer 306, are similar to the layers in FIG. 4D except for the addition of layer 502. In certain embodiments, the conductive material for the low-resistivity outer layer 306 is TiN, although other conductive materials can also be used as described herein. For one example embodiment, the material layer 442 is AlO; the material layer 444 is SiN; material layer 446 is oxide; the material layer 502 is silicon oxygen nitride (SiON); the material layer 448 is silicon; and material layer 450 is oxide. As indicated above, different multilayer structures can also be used for the plug 304. Other variations can also be implemented while still taking advantage of the techniques described herein.

Figure 6:
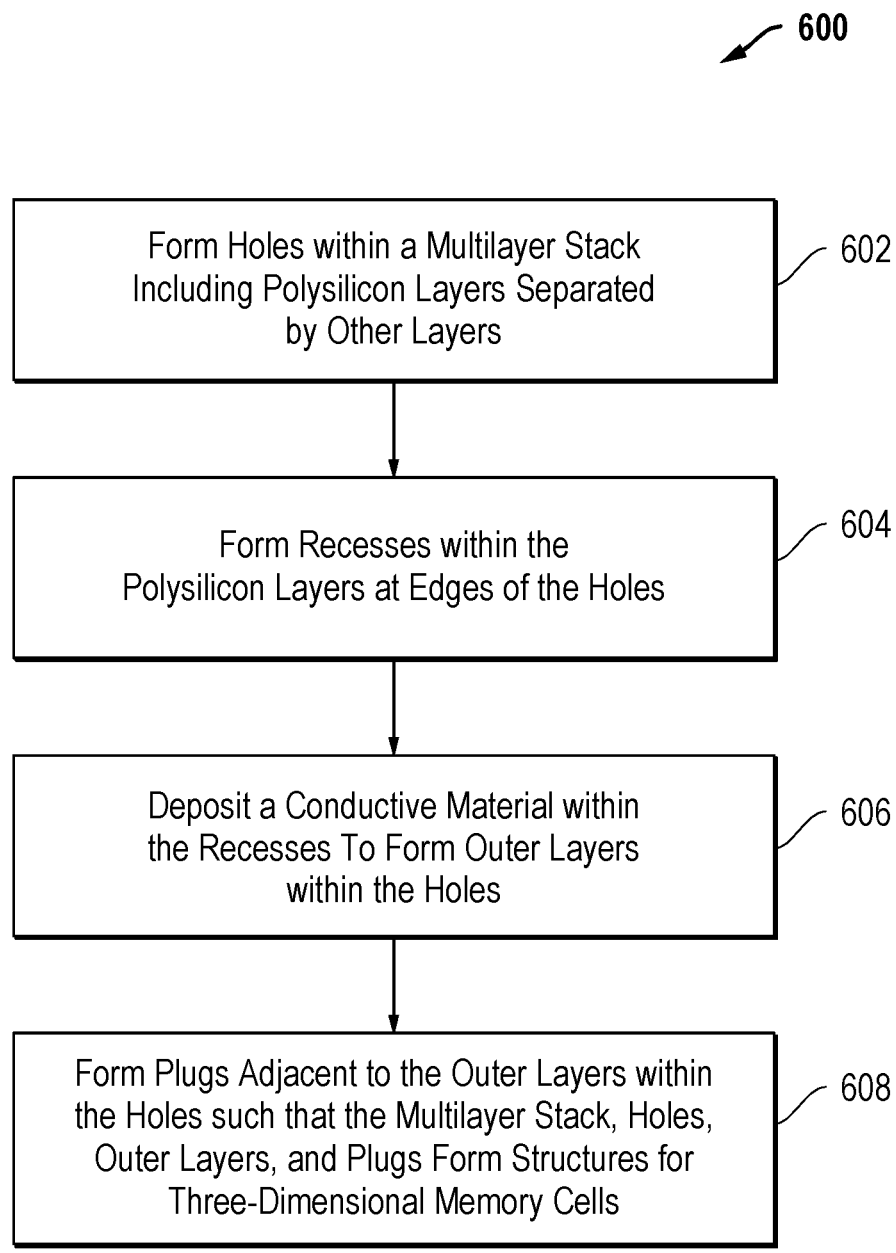
FIG. 6 illustrates a process flow diagram of an example method for forming structures for 3D memory cells, according to certain embodiments of this disclosure.

FIG. 6 illustrates a process flow diagram 600 of an example method for forming structures for 3D memory cells, according to certain embodiments of this disclosure. In block 602, holes 104 are formed within a multilayer stack 102 that includes polysilicon layers 106 separated by other layers (e.g., oxide layers 108). In block 604, recesses 422 (and possibly recesses 424) are formed within polysilicon layers 106 at edges of holes 104. In block 606, conductive material 432 is deposited within recesses 422 (and possibly recesses 424) to form outer layers 306 within holes 104. In block 608, plugs 304 are formed adjacent to outer layers 306 within holes 104. Multilayer stack 102, holes 104, outer layers 306, and plugs 304 form structures for 3D memory cells. In certain embodiments, a target level of resistivity is achieved across the structures by depositing conductive material 432 within recesses 422 formed in polysilicon layers 106. In certain embodiments, holes 104 can be channel holes for the 3D memory cells, and polysilicon layers 106 and the low-resistivity outer layers 306, formed by depositing conductive material 432 within recesses 422, can form gates for the 3D memory cells. Further, silicon layers within plugs 304 can provide channels for the 3D memory cells. Additional or different process steps can also be used while still taking advantage of the processing techniques described herein.

One or more deposition processes can be used to form the material layers described herein. For example, one or more depositions can be implemented using CVD, PECVD, PVD, ALD, and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions.

Lithography processes with respect to photoresist layers can be implemented using optical lithography, extreme ultra-violet (EUV) lithography, and/or other lithography processes.

The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases.

In addition, operating variables for process steps can be controlled to ensure that critical dimension (CD) target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

FIGS. 7A-7K illustrate cross-sectional views 700, 705, 710, 715, 720, 725, 730, 735, 740, 745, and 750 of an example structure during an example process for forming a 3D structure according to certain embodiments of this disclosure. To provide a more detailed view and for ease of illustrating forming holes 104, outer layers 306 (including forming recesses 422/424 and depositing conductive material 432), and plugs 304, FIGS. 7A-7K show multilayer stack 102 to include few layers than are illustrated in FIGS. 4A-4D, thereby providing a more detailed view of a structure similar to the structure shown in FIGS. 4A-4D. It should be understood, however, that multilayer stack 102 may include any suitable number of layers. Although particular etch and deposition are described with reference to FIGS. 7A-7K, this disclosure contemplates forming holes 104, outer layers 306 (including forming recesses 422/424 and depositing conductive material 432), and plugs 304 using any suitable combination of etch and deposition processes. Although sidewalls of holes 104 are shown as being generally parallel to one another, the sidewalls of holes 104 may be tapered in a similar manner to that shown in FIGS. 4A-4D (e.g., with a larger opening near the tops of hole 104 than at the bottom of holes 104), or may have any other suitable design.

Figure 7A:
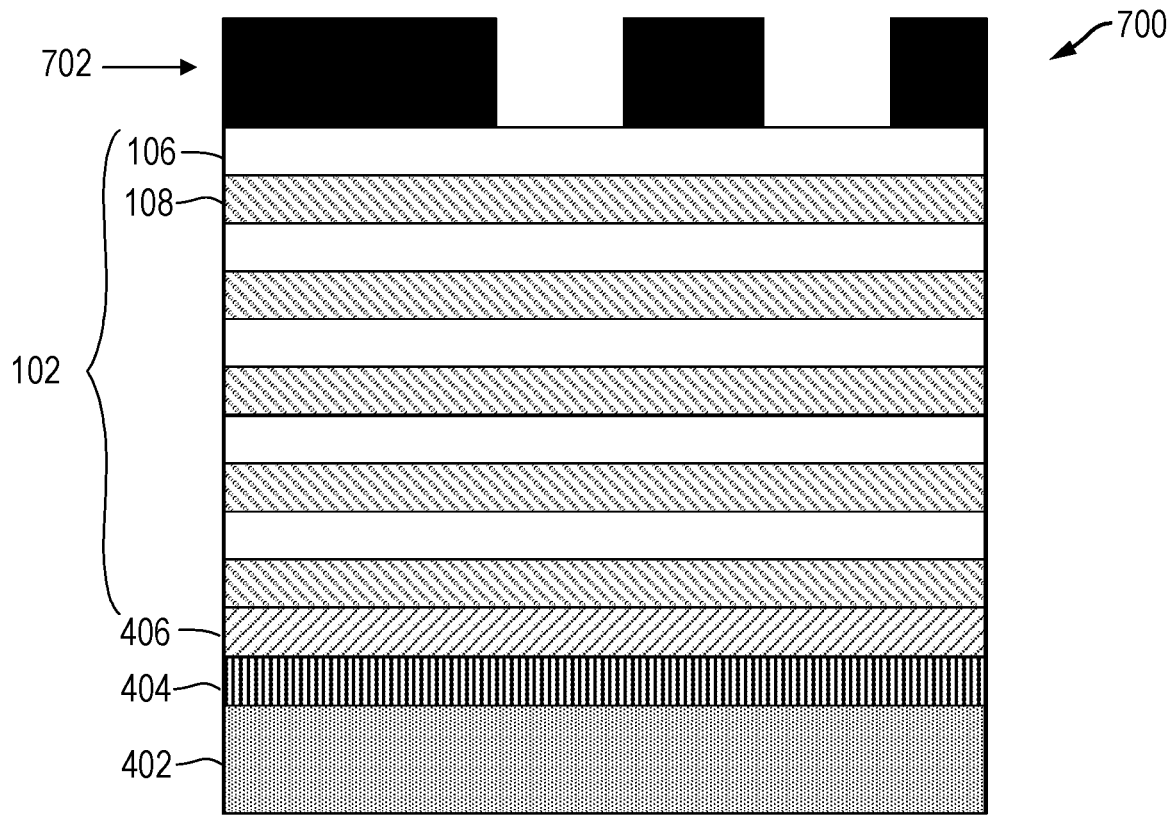
FIGS. 7A-7K illustrate cross-sectional views of an example structure during an example process for forming a 3D structure, according to certain embodiments of this disclosure.

As illustrated in FIG. 7A, a multilayer stack 102 that includes alternating polysilicon layers 106 and oxide layers 108 is formed over layer 402, which may be a semiconductor substrate, such as a silicon substrate. Although primarily described as polysilicon, the material of polysilicon layers 106 may be any suitable conductive material, such as any material that is suitable for acting as a gate in a transistor (e.g., a gate in a transistor of a 3D NAND memory device). Although primarily described as an oxide material the material of oxide layers 108 may be any suitable insulating material. Thus, as an example, stack 102 may be an OPOP stack. In the illustrated example, layers 404 and 406 are formed between multilayer stack 102 and layer 402. In certain embodiments, layer 404 can be AlO, SiN, or another etch-stop material; and layer 406 can be N-doped polysilicon or another conductive material.

Layers 106, 108, 402, 404, and 406 may be formed by a suitable deposition method, such as sputtering, CVD, PECVD, MBE, ALD, etc. As just one example, layers 106, 108, 404, and 406 may be 6 nm to 100 nm thick, and the thicknesses of these layers may be the same or may vary in any suitable combination.

The illustrated semiconductor structure further includes a hole pattern 702 for forming holes 104. For example, hole pattern 702 may include openings that expose surfaces of multilayer stack 102 through which holes 104 are to be etched. Hole pattern 702 may be formed using a lithography process. In certain embodiments, hole pattern 702 is a masking layer that is resistant to etching in a subsequent etching process for forming holes 104. Hole pattern 702 may include any suitable material, such as one or more layers of photoresist and/or hard mask material. In an example in which holes 104 ultimately serve as holes for forming channels of a device (e.g., a 3D NAND memory device), hole pattern 702 may be considered a channel pattern.

Figure 7B:
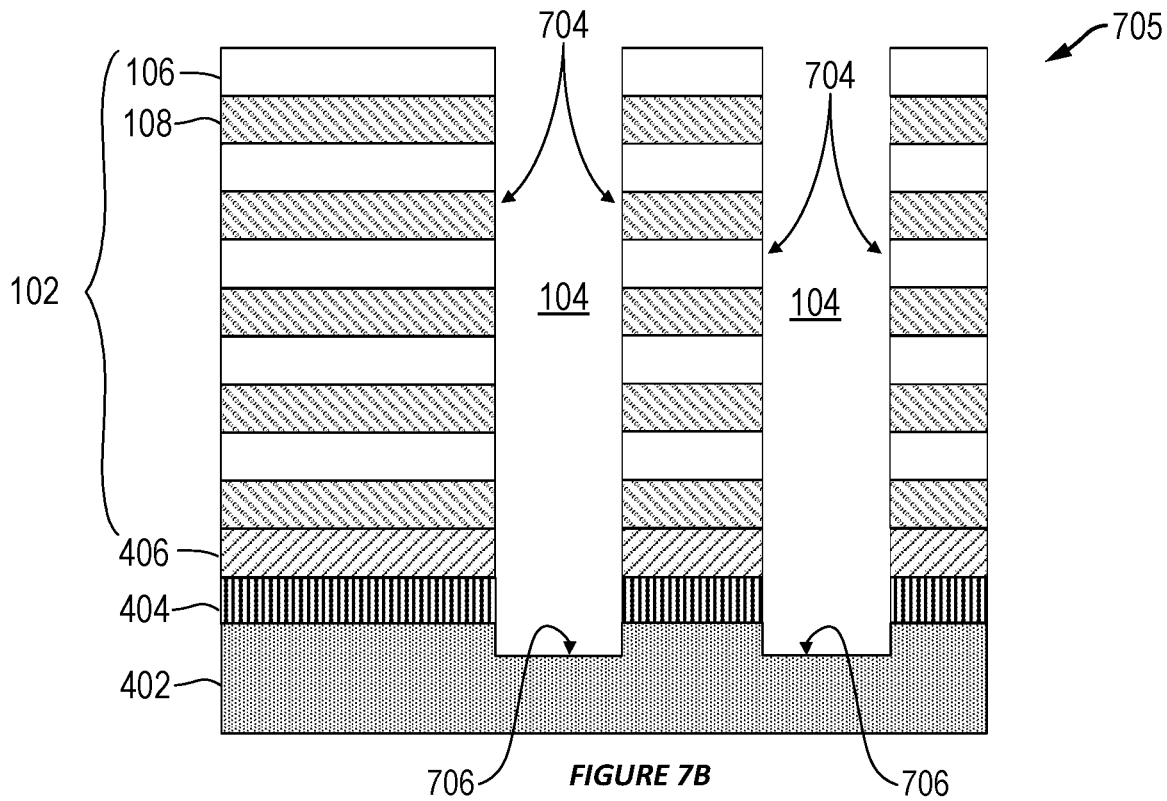

As illustrated in FIG. 7B, holes 104 are formed in multilayer stack 102 (through polysilicon layers 106 and oxide layers 108) and, in the illustrated example, though layers 406, 404, and into layer 402. For example, using hole pattern 702 as an etch mask, the material of multilayer stack 102 (through polysilicon layers 106 and oxide layers 108) and, in the illustrated example, though layers 406, 404, and into layer 402) is etched to form holes 104 using an appropriate etch technique or combination of etch techniques. As just one example, holes 104 may be formed using a plasma etching technique, such as RIE, within one or more plasma tools. The plasma etching process may include a cyclic process designed to alternately etch the alternating materials of polysilicon layers 106 and oxide layers 108 of multilayer stack 102 in certain embodiments. Alternatively, the plasma etching technique may include a plasma etch tuned to have the same selectivity to etching the material of polysilicon layers 106 and the material of oxide layers 108. In one example, a plasma used for etching holes 104 includes chlorine gas; however, this disclosure contemplates using any suitable gas or combination of gases. Additionally, certain embodiments may incorporate a chemical oxide etch process to remove portions of multilayer stack 102 (or other layers) that are oxide layers.

Each of holes 104 may have sidewalls 704 defined by exposed surfaces of the etched layers (e.g., polysilicon layers 106, oxide layers 108, layer 406, layer 404, and layer 402) at the edges of holes 104. In certain embodiments, sidewalls 704 are substantially vertical. In the illustrated example, bottom surfaces 706 of holes 104 are, in this example, exposed top surface of layer 402 (e.g., a substrate layer), which in one example may include a diffusion region of a bitline in the underlying layer 402.

Following the etching to form holes 104, any remaining hole pattern 702 may be removed using a suitable removal process.

Figure 7C:
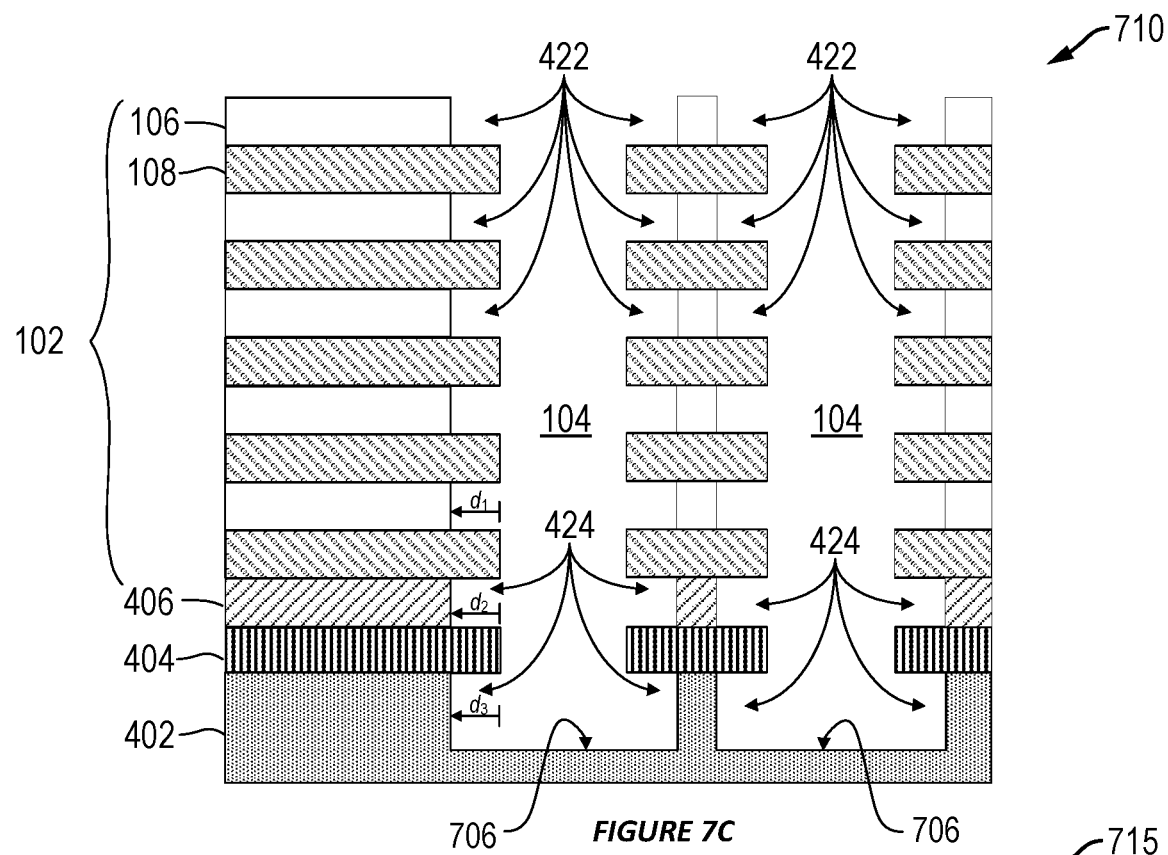
Figure 7D:
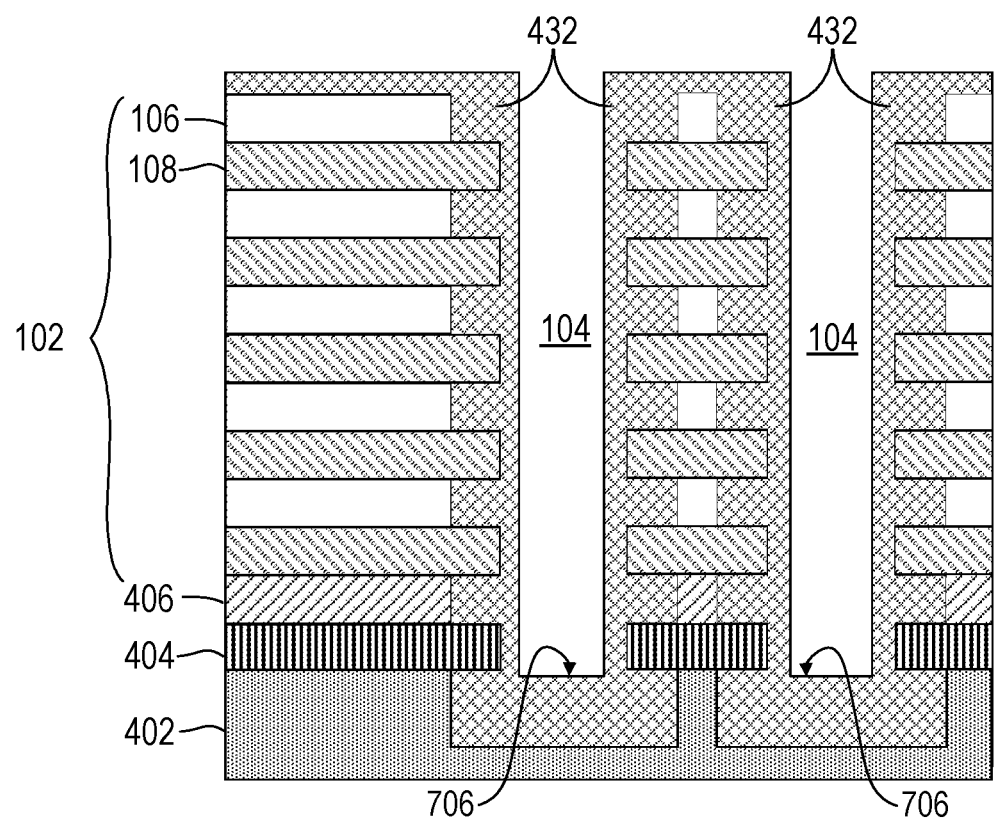
Figure 7E:
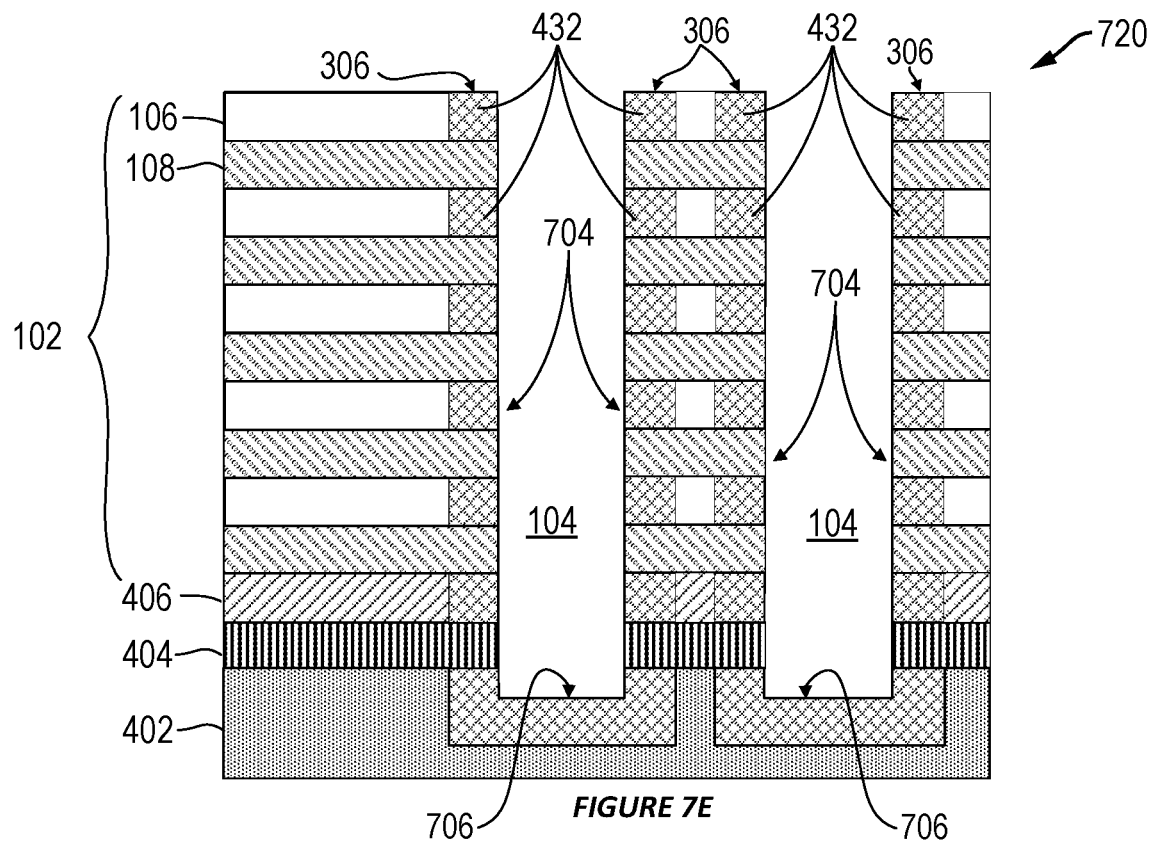

FIGS. 7C-7E illustrate cross-sectional views 710, 715, and 720 of the example structure during an example process for forming outer layers 306, according to certain embodiments of this disclosure.

As shown in FIG. 7C, recesses 422 are formed in polysilicon layers 106 along sidewalls 704 at the edges of holes 104. In the illustrated example, the one or more etch processes also form recesses 424 in layers 402 and 406. Furthermore, in the illustrated example, the one or more etch processes also remove a portion of the material of layer 402 at bottom surface 706 of hole 104, thereby lowering bottom surface 706 of hole 104.

Recesses 422 and 424 may be formed using any suitable type of etch process, such as one or more wet etch processes, plasma etch processes, RIE processes, and/or other etch processes or combinations of etch processes. The etch process(es) may be selective to etching the material of polysilicon layers 106 (as well as layers 406 and 402) relative to etching the material of oxide layers 108.

Depending on the materials of layers 402 and 406, one or more different etch processes, potentially using similar etch processes with a different etch chemistry or an entirely different etch technique, may be used to etch recesses 424 in layers 402 and 406 than was used to etch recesses 422 in polysilicon layers 106. As just one particular example, if both polysilicon layers 106 and layer 406 include polysilicon, then recesses 422 in polysilicon layers 106 and recesses 424 in layer 406 may be etched using a similar etch process, potentially in a single etch step (which may itself include one or more etch cycles, if appropriate). Continuing with this particular example, layer 402 may include a different material and may be etched using a different etch processes and/or in a different etch step to form recesses 424 in layer 402.

Although recesses 422 are shown as having particular depths ($d_1$) within polysilicon layers 106, recesses 422 may have any suitable depths ($d_1$) within polysilicon layers 106. Additionally, although recesses 424 are shown as having particular depths ($d_2$ and $d_3$) within layers 406 and 402, recesses 424 may have any suitable depths ($d_2$ and $d_3$) within layers 406 and 402. As just one particular example, recesses 422 and/or recesses 424 may be approximately 10 nm to 30 nm deep. Recesses 422 may have the same depths or may vary in depth, and recesses 424 may have the same depths or may vary, as desired. Furthermore, recesses 422 and recesses 424 may have the same depths or may vary in depth relative to each other.

As illustrated in FIG. 7D, conductive material 432 is deposited within recesses 422 and 424. In this example, conductive material 432 also is deposited over top polysilicon layer 106 and over exposed surfaces of oxide layers 108 within holes 104. Additionally, conductive material 432 overfills recesses 422 and 444 (e.g., into holes 104) beyond sidewalls 704 of oxide layers 108 adjacent the recess 422 or 444. In certain embodiments, conductive material 432 may be formed using an ALD process, a CVD, plasma deposition process, or any other suitable process.

As illustrated in FIG. 7E, a portion of conductive material 432 formed in FIG. 7D may be removed, leaving conductive material 432 substantially filling recesses 422 and 424. For example, portions of conductive material 432 formed on the surfaces of the top polysilicon layer 106 and formed on sidewalls 704 of oxide layers 108 and layer 404 may be removed such that conductive material 432 substantially fills recesses 422 and 424 and is substantially level with sidewalls 704 of oxide layers 108 and layer 404. That is, sidewalls 704 of holes 104 may now include alternating substantially level surfaces of conductive material 432 (in recesses 422) and oxide layers 108, as well as surfaces of layer 404. In certain embodiments, a portion of conductive material 432 at the bottoms of holes 104 also may be removed such that a thickness of conductive material 432 at the bottom of holes 104 is reduced, lowering bottom surface 706 of holes 104. Conductive material 432 in recesses 422 may form the above-described outer layers 306.

This disclosure contemplates any suitable wet or dry etch process to remove conductive material 432. In certain embodiments, the etch process is an isotropic etch process. As just one example, a plasma etching process may be used to remove conductive material 432.

Figure 7F:
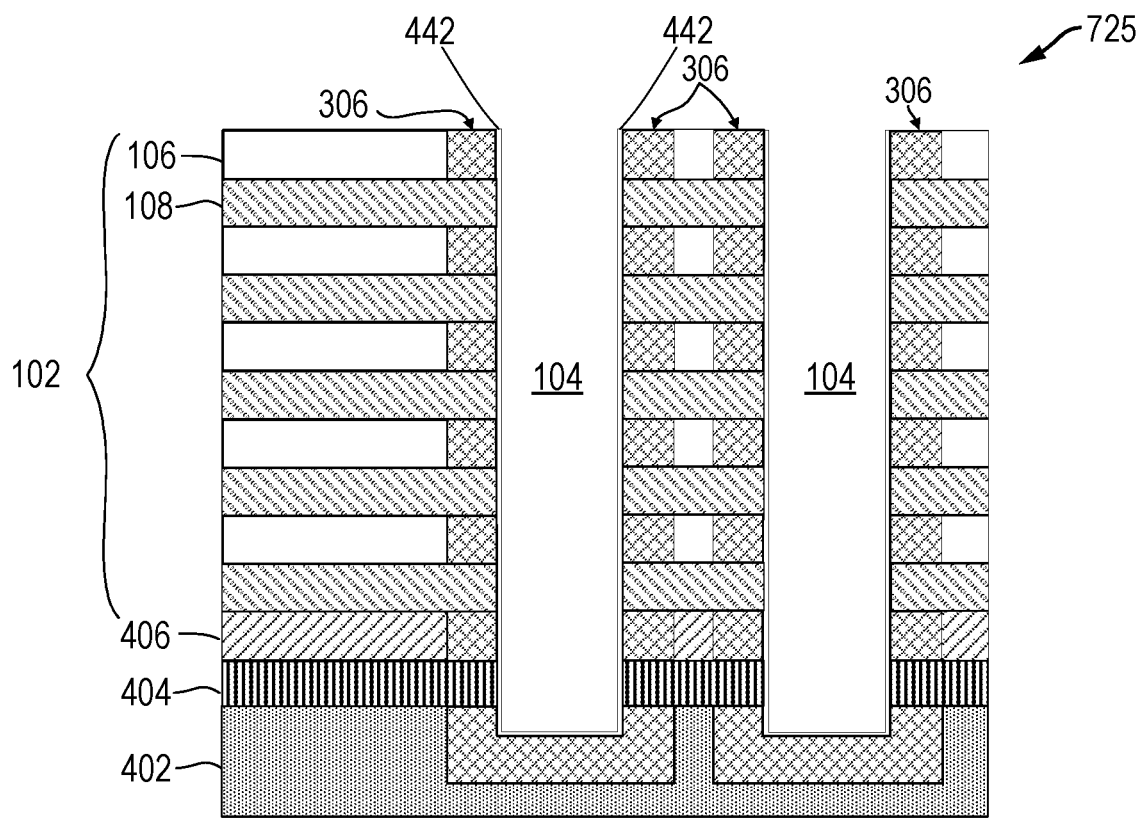
Figure 7G:
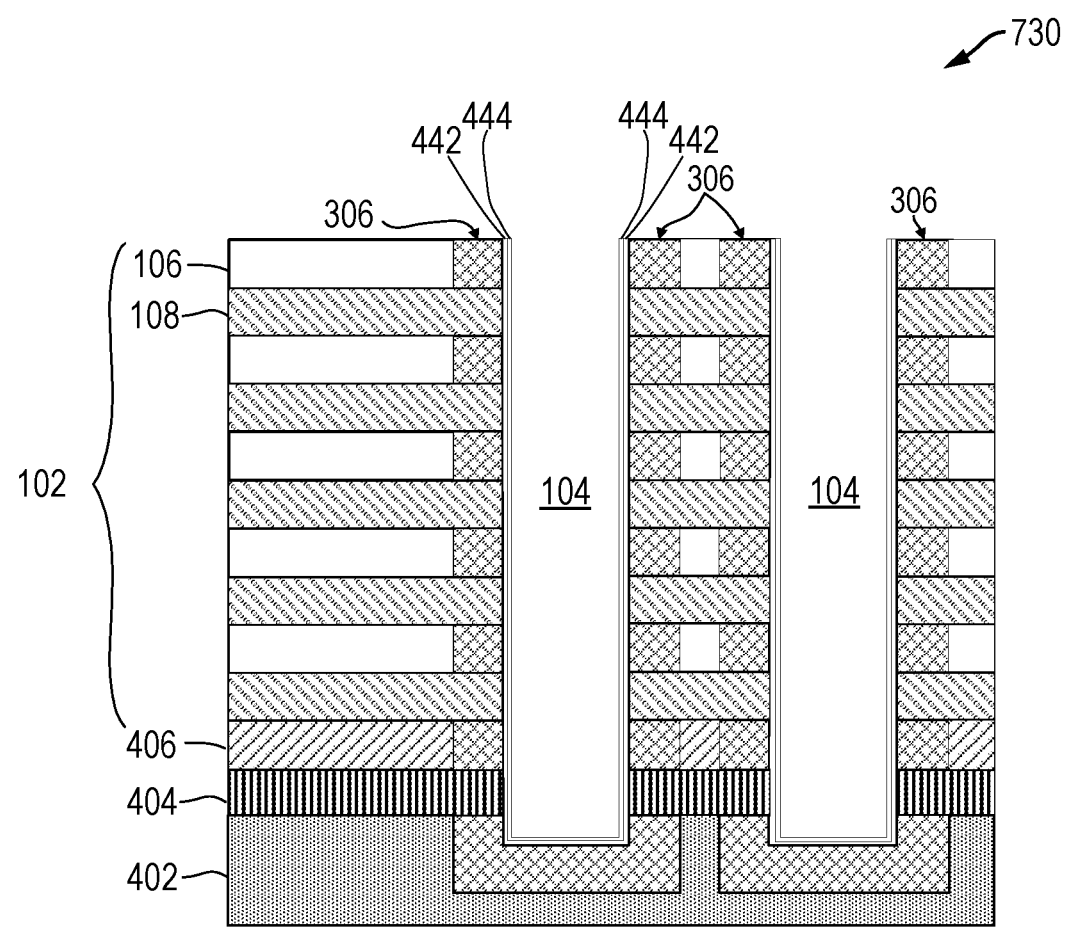
Figure 7H:
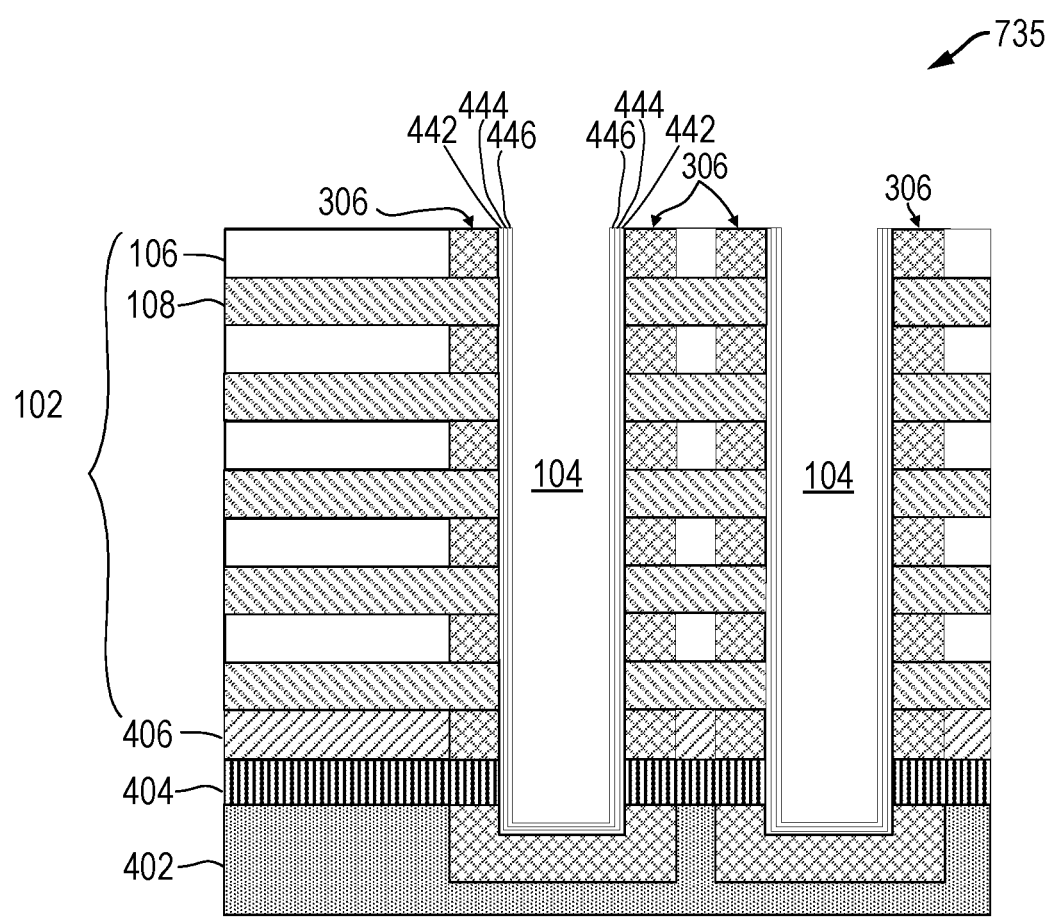
Figure 7I:
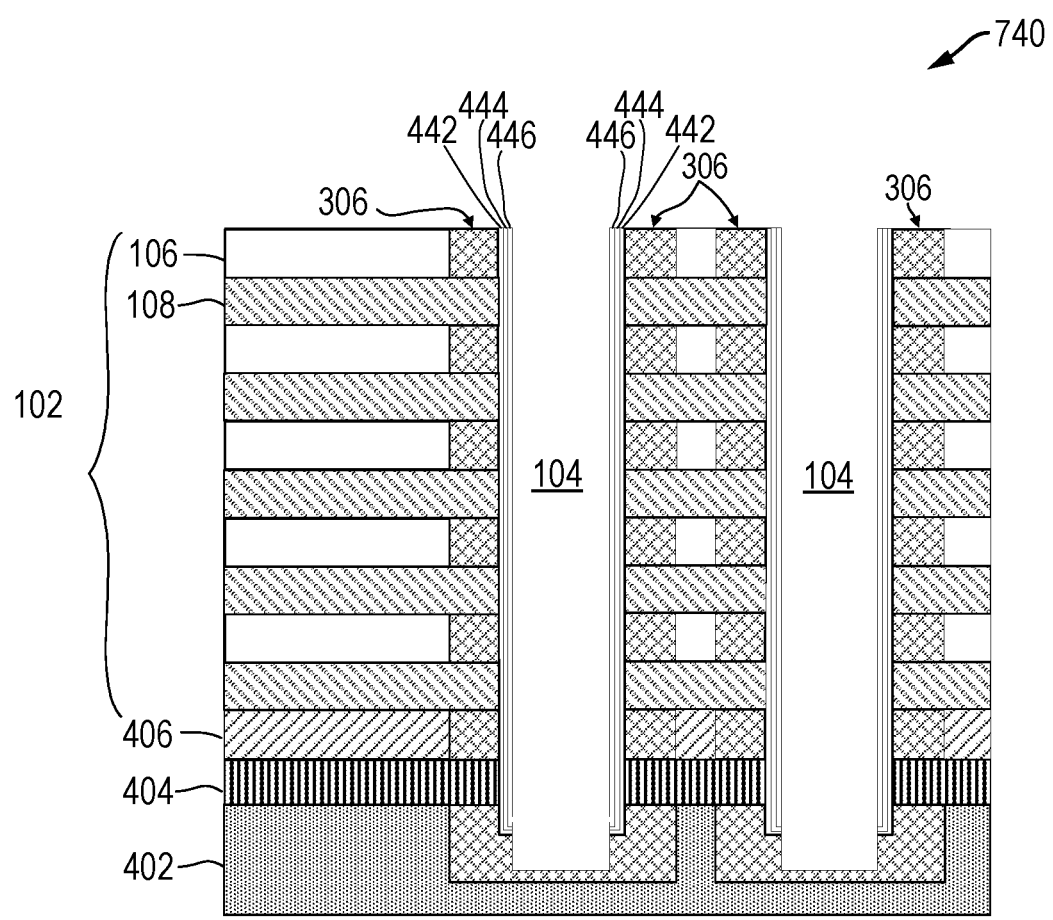
Figure 7J:
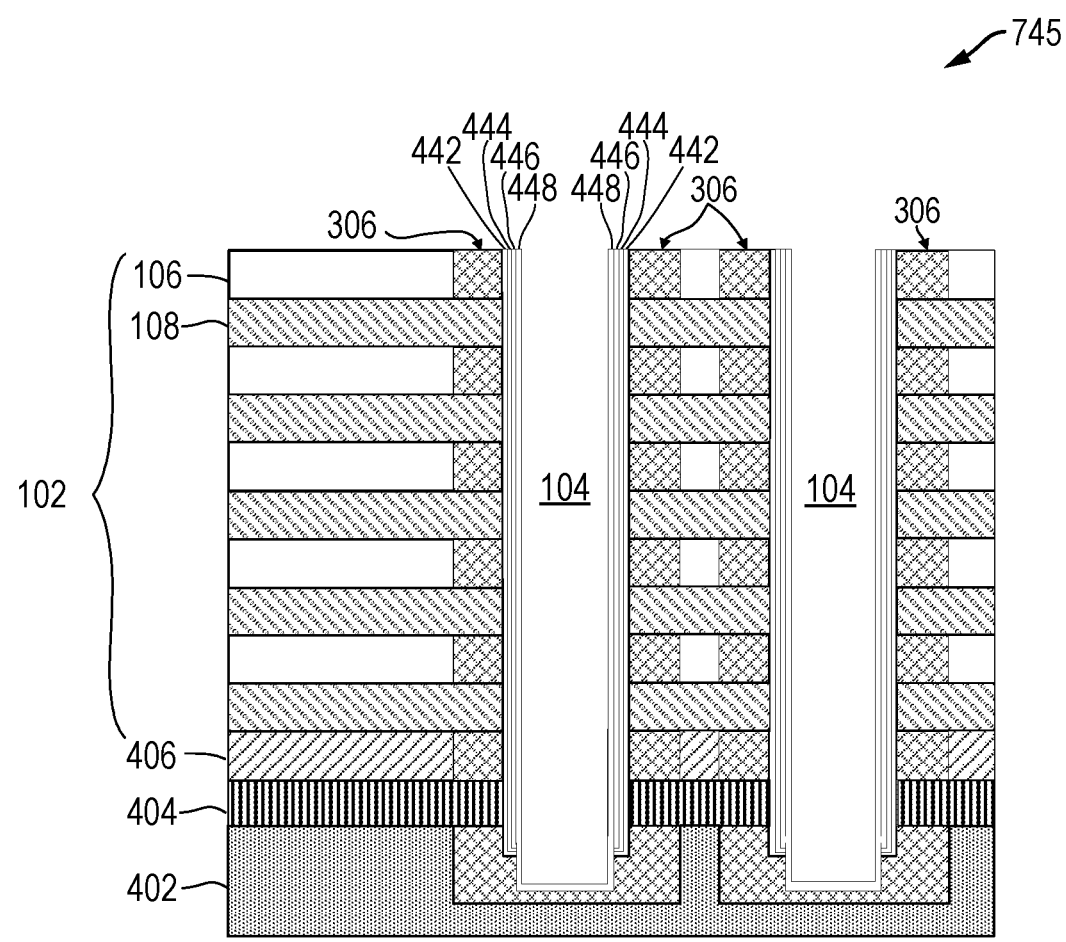
Figure 7K:
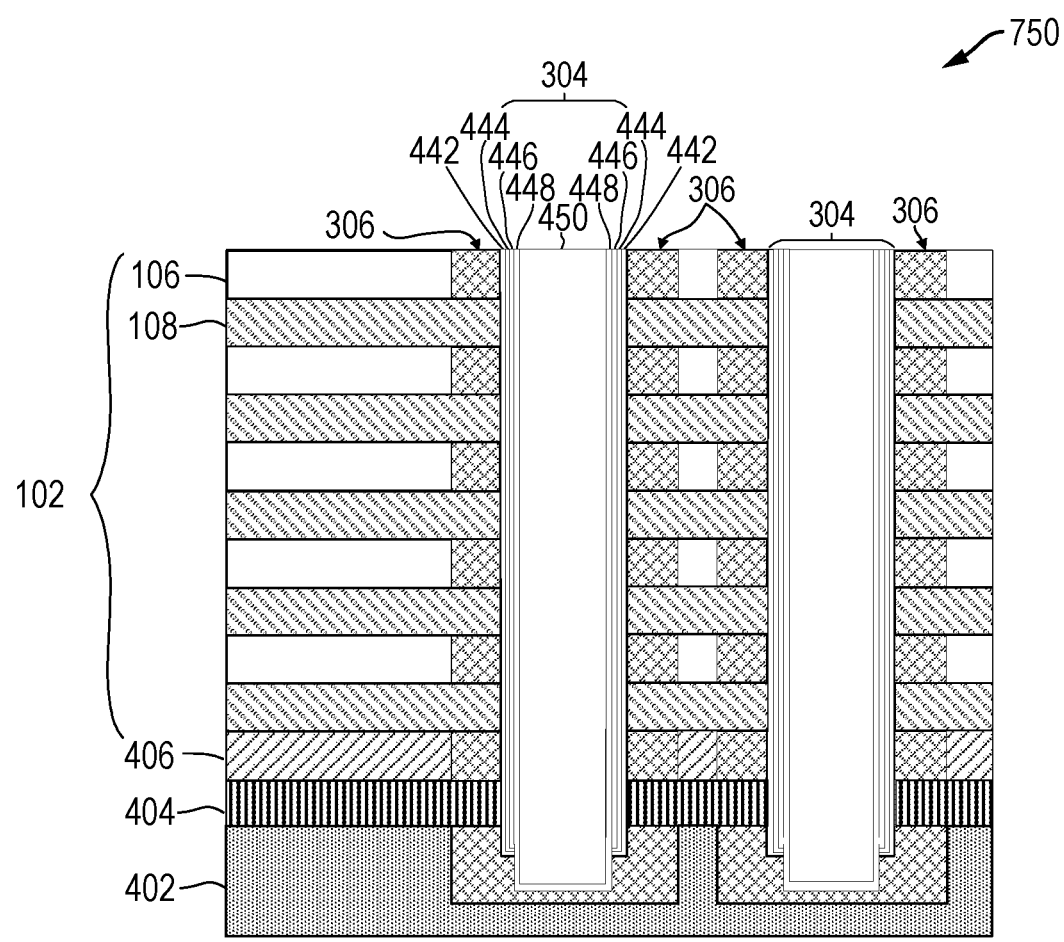

FIGS. 7F-7K illustrate cross-sectional views 725, 730, 735, 740, 745, and 750 of the example structure during an example process for forming plugs 304 in holes 104, according to certain embodiments of this disclosure. In general, the layers formed throughout FIGS. 7F-7K to form plugs 304 (as shown in FIG. 7K) correspond to layers 442, 444, 446, 448, and 450 that form plugs 304 in FIG. 4D. Holes 104, however, may be filled with any suitable material. For example, plugs 304 could include layers 442, 444, 446, 502, 448, and 450, as shown in FIG. 5. The processes for forming plugs 304 may include any suitable combination of deposition processes and etch processes. The deposition processes can include one or more ALD processes, CVD processes, plasma deposition processes, and/or other layer deposition processes or combinations of processes. The etch processes, to the extent used, can include one or more wet etch processes, plasma etch processes, RIE processes, and/or other etch processes or combinations of etch processes.

As shown in FIG. 7F, layer 442 may be formed in hole 104 along sidewalls 704 of holes 104 and along bottom surfaces 706 of holes 104 (which now includes conductive material 432). In certain embodiments, layer 442 is, or is part of, a gate dielectric between a gate (formed by the remaining portion of a polysilicon layer 106 and the conductive material 432 that replaced a portion of the polysilicon layer 106) and the channel being formed in hole 104 by portions of plug 304. In certain embodiments, layer 442 is deposited to have a generally uniform thickness on sidewalls 704 and bottom surfaces 706 of holes 104. Layer 442 may be formed using any suitable deposition process, such as an ALD process, a CVD process, a plasma deposition process, or any other suitable deposition process. In certain embodiments, layer 442 has a thickness of about 2 nm to about 10 nm.

Layer 442 may include any material suitable for use as, or as part of, a gate dielectric. For example, the material may be a high-k material, such as a metal oxide. Example metal oxides that may be used for layer 442 include AlO, $HfO_2$, hafnium silicate (HfSiO), tantalum pentoxide ($Ta_2O_5$), or other metal oxides.

The formation of metal, low resistivity outer layers 306 by replacing a portion of polysilicon layers 106 at edges of holes 104 with the metal, low resistivity conductive material 432 may allow a high-k dielectric to be used as a first layer (layer 442) of plugs 304, which might not be possible or result in an adequately functioning device if polysilicon extended to the edges of holes 104. That is, because at least a portion of a gate structure (polysilicon layers 106 plus outer layers 306) at the edges of holes 104 may now be metal, a high-k dielectric may be used as a first layer of plugs 304 that is in contact with the gate (e.g., at the conductive material 432 of outer layers 306).

Thus, rather than being limited to SONOS structures according to conventional techniques that use an OPOP stack, replacing a portion of polysilicon layers 106 in an OPOP stack (or the like) with a metal conductive material at edges of holes 104 (thereby forming outer layers 306), embodiments of this disclosure may allow formation of plug 304 as multiple material layers that include Tantalum (or another suitable metal for conductive material 432), AlO (or another suitable metal, such as another suitable high-k metal oxide, for the gate dielectric), nitride (e.g., SiN), oxide, and silicon layers, to form what may be referred to as a TANOS structure. Among other potential benefits, the use of a high-K dielectric (e.g., as layer 442 of plug 304), may allow for increased gate capacitance with reduced or eliminated leakage currents, which in certain embodiments may reduce power consumption and increase device reliability relative to devices that do not use a high-k dielectric.

As shown in FIG. 7G, layer 444 may be formed in hole 104 on layer 442 within holes 104. In certain embodiments, layer 444 is, or is part of, a gate dielectric between the gate (formed by the remaining portion of a polysilicon layer 106 and the conductive material 432 that replaced a portion of the polysilicon layer 106) and the channel being formed in hole 104 by portions of plug 304. In certain embodiments, layer 444 is deposited to have a generally uniform thickness. Layer 444 may be formed using any suitable deposition process, such as an ALD process, a CVD process, a plasma deposition process, or any other suitable deposition process.

In certain embodiments, layer 444 has a thickness of about 2 nm to about 10 nm. Layer 444 may include any material suitable for use as, or as part of, a gate dielectric.

For example, the material of layer 444 may be SiN, but also could be silicon oxide, SiN, silicon oxynitride.

As shown in FIG. 7H, layer 446 may be formed in hole 104 on layer 444 within holes 104. In certain embodiments, layer 446 is, or is part of, a gate dielectric between the gate (formed by the remaining portion of a polysilicon layer 106 and the conductive material 432 that replaced a portion of the polysilicon layer 106) and the channel being formed in hole 104 by portions of plug 304. In certain embodiments, layer 446 is deposited to have a generally uniform thickness. Layer 446 may be formed using any suitable deposition process, such as an ALD process, a CVD process, a plasma deposition process, or any other suitable deposition process.

In certain embodiments, layer 446 has a thickness of about 2 nm to about 10 nm. Layer 446 may include any material suitable for use as, or as part of, a gate dielectric. For example, the material of layer 446 may be an oxide, such as silicon oxide for example.

As shown in FIG. 7I, an etch may be performed to extend holes 104 into the conductive material 432 deposited at the bottoms of holes 104. The etch to extend holes 104 into conductive material 432 at the bottom of holes 104 may include performing one or more etch processes to remove layers 442, 444, and 446 at the bottoms of holes 104, and possibly to also etch into the conductive material 432 at the bottoms of holes 104. The etch process(es) may include one or more wet etch processes and/or one or more dry etch processes (e.g., one or more plasma etch processes). In certain embodiments, the etch process(es) removes little to no portion of layer 446 along sidewalls 704 of holes 104. As just one example, the etch process(es) may be an isotropic etch process.

Removing layers 442, 444, and 446 at the bottoms of holes 104 (and possibly extending holes 104 into the conductive material 432 at the bottoms of holes 104) exposes conductive material 432 at the bottoms of holes 104 and allows physical contact to be made between a subsequently deposited layer (e.g., layer 448, which may act as a channel region) and the conductive material 432 at the bottoms of holes 104. This physical contact may allow a source or drain contact to be made between layer 448 and a source/drain line that is coupled to conductive material 432.

Although a particular technique is described for making contact between layer 448 and a source and/or drain line, this disclosure contemplates conductively coupling layer 448 and a source and/or drain line in any suitable manner. For example, layer 404 and portions of layers 442, 444, and 446 between layer 404 and layer 448 may be removed, and layer 404 (or the area at which layer 404 was previously located) may be refilled with a conductive material, such as doped silicon or a metal, that then contacts layer 448.

As shown in FIG. 7J, layer 448 may be formed in hole 104 on layer 446 within holes 104. In certain embodiments, layer 448 could be used as a channel within 3D memory cells such as 3D vertical NAND memory cells. In certain embodiments, layer 448 is deposited to have a generally uniform thickness. Layer 448 may be formed using any suitable deposition process, such as an ALD process, a CVD process, a plasma deposition process, or any other suitable deposition process.

Layer 448 may include any material suitable for use as, or as part of, a channel. For example, the material of layer 448 may be silicon. In certain embodiments, layer 448 is in situ (e.g., as part of a plasma process for depositing layer 448) doped to a doping concentration of $10^{14}$ cm$^{-3}$ to $10^{18}$ cm$^{-3}$, and may be doped to be n-type with phosphorus.

In general, layer 448 may be very thin. Thinning may avoid degradation and loss of control of the thin film transistor and improves the transistor's subthreshold characteristics. In certain embodiments, layer 448 can be deposited slightly thicker than a target thickness and then thinned as appropriate for the transistor using an atomic layer etching process. In certain embodiments, the polysilicon layer 110 after the thinning is about 5 nm to about 50 nm, for example, between 10 nm and 20 nm in one embodiment.

As shown in FIG. 7K, layer 450 may be formed in hole 104 on layer 448 within holes 104, and may substantially fill a remainder of holes 104. Layer 450 may include any material suitable for use as a filler. For example, the material of layer 450 may be an oxide material. Layer 450 may be formed using any suitable deposition process, such as an ALD process, a CVD process, a plasma deposition process, or any other suitable deposition process.

A silicon material layer, such as material layer 448, could be used as a channel within 3D memory cells such as 3D vertical NAND memory cells. Polysilicon layers 106 within the multilayer stack 102, as shown in FIGS. 4A-4D, can be used to provide gates within 3D memory cells, such as 3D vertical NAND memory cells. The low-resistivity outer layer 306, which is formed by depositing conductive material 432 within recesses 422 as shown in FIG. 4C, reduces the resistivity of these gates thereby improving memory performance.

Figure 8A:
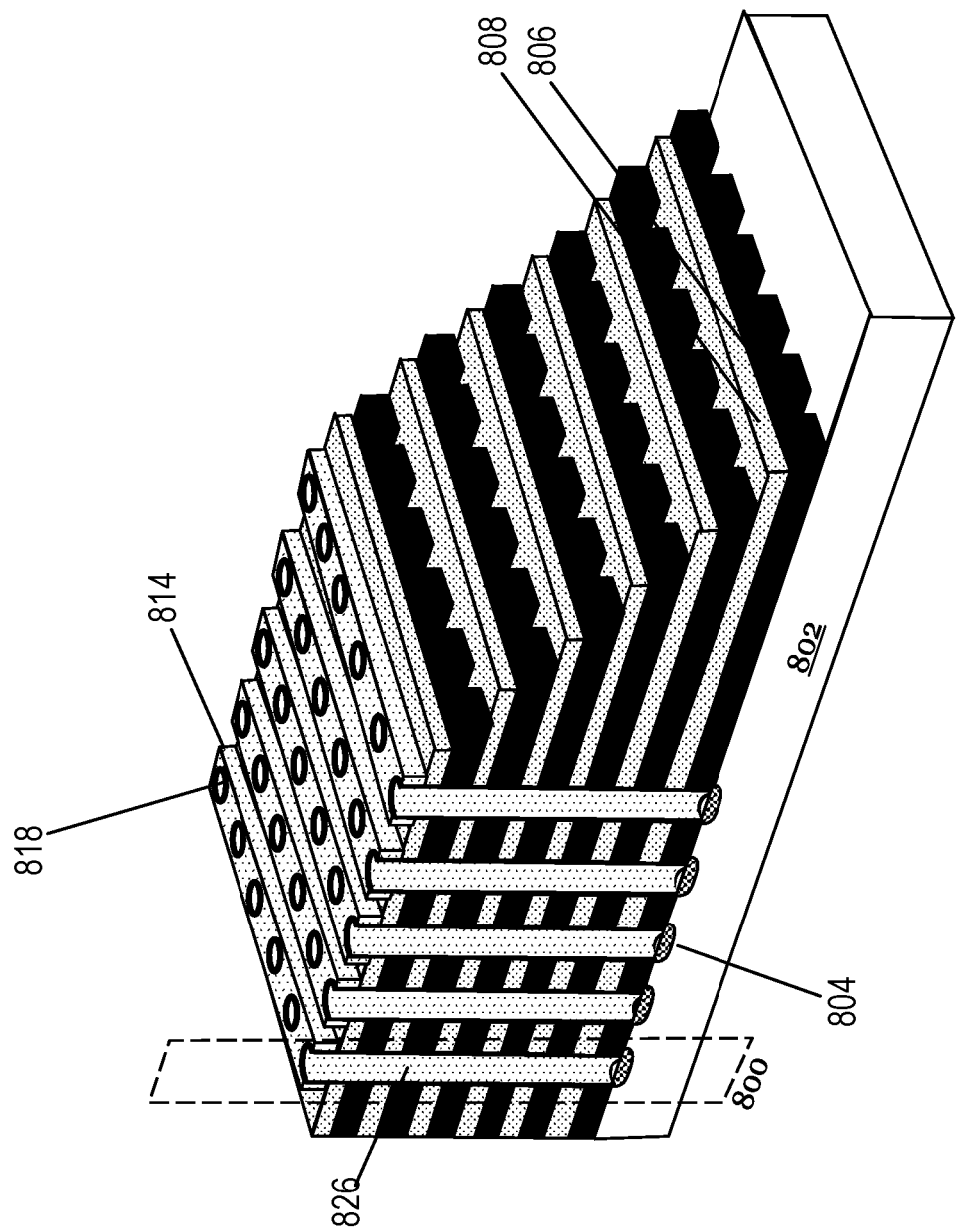
FIGS. 8A-8B illustrate example aspects of a 3D NAND memory array, according to certain embodiments of this disclosure.
Figure 8B:
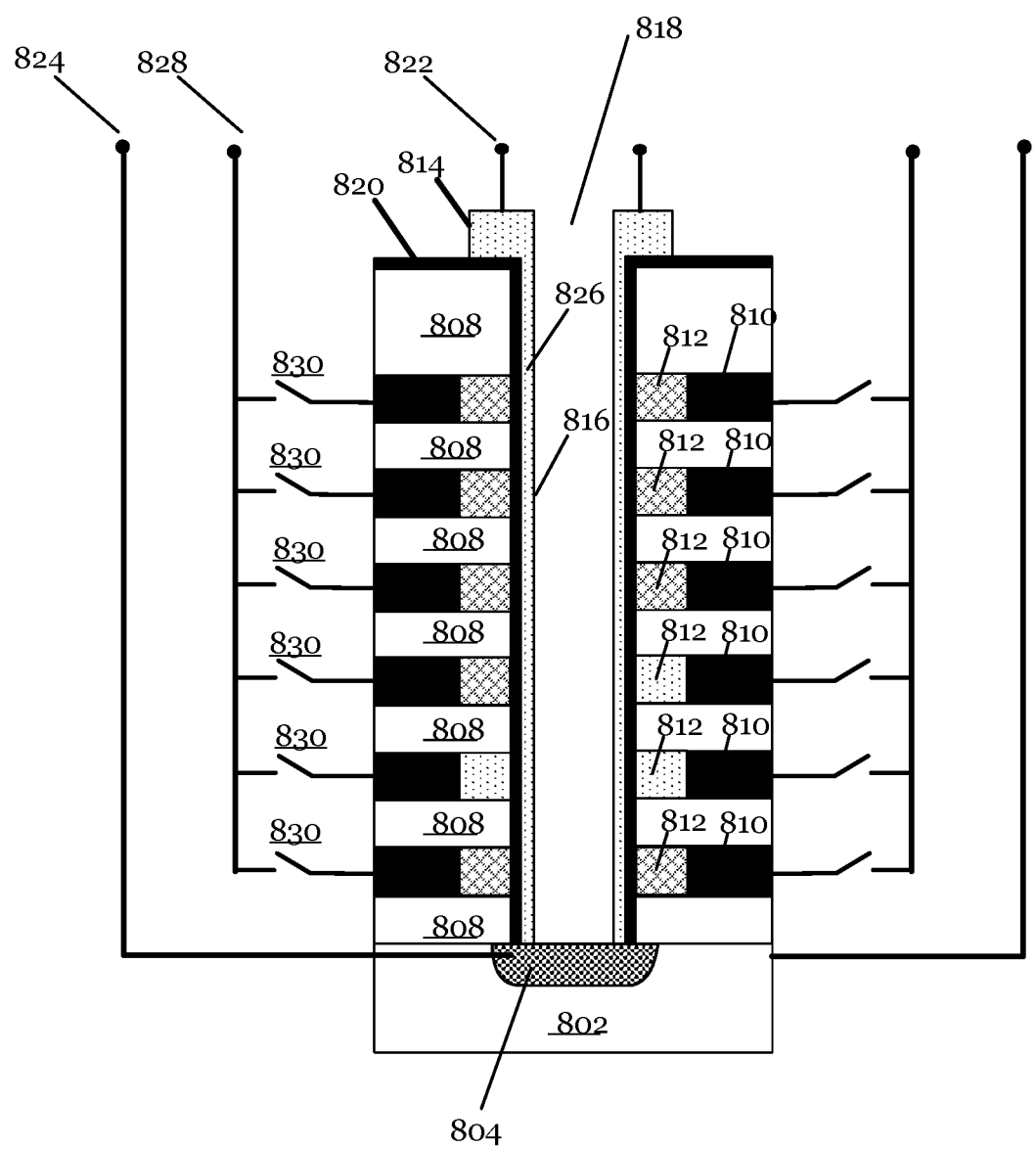

FIGS. 8A-8B illustrate example aspects of a 3D NAND memory array, according to certain embodiments of this disclosure. FIG. 8A illustrates a projection view of a cross-section through a 3D-NAND memory array formed in accordance with embodiments of this disclosure. FIG. 8B illustrates a cross-sectional view through a stack (e.g., multilayer stack 102 described previously) of memory transistors in a 3D-NAND memory array formed in accordance with embodiments of this disclosure. In particular, FIG. 8B illustrates a cross sectional view of an example 3D NAND wordline stack (e.g., multilayer stack 102 described previously) of alternating gates (wordlines) and insulating layers formed in accordance with embodiments of the invention.

FIG. 8A illustrates a semiconductor substrate 802 with a common drain bitline 804 formed therein. The cross section shows alternating layers of dielectric material 808 (e.g., oxide layers 108) that electrically isolate layers of wordlines 806 (e.g., polysilicon layers 106 and outer layers 306). Wordlines 806 are the alternating metal gates of stacked memory transistors in the 3D NAND array. As can be seen more clearly in FIG. 8B, wordlines 806 include both a polysilicon portion 810 and a conductive material portion 812, both of which are labeled only on the right side of FIG. 8B to avoid overcrowding the left side of FIG. 8B. Polysilicon portion 810 corresponds to the portion of polysilicon layers 106 following formation of recesses 422, and conductive material portion 812 corresponds to outer layer 306 (and the associated conductive material 432) described above. The material of conductive material portion 812 has a lower resistivity than the polysilicon of polysilicon portion 810.

Common source bitlines 814 (e.g., including polysilicon), cross the top surface of the 3D NAND memory array perpendicular to the wordlines 806. The drain and source bitlines 804 and 814 are connected to thin transistor channels 816 (shown in FIG. 1B), made of silicon for example, on the sidewalls of channels 818, which may correspond to holes 104 described above. The memory transistors in a layer of wordlines 806 share the common source bitlines 814 and common drain bitlines 804.

The cross sectional view illustrated in FIG. 8B through a stack of nonvolatile transistors in a 3D NAND memory array is depicted by the dashed box 800 in FIG. 8A.

Each transistor includes a gate (wordline 806, including one or more polysilicon portions 810 and one or more conductive material portions 812) that is isolated from the transistor channel 816 by gate dielectric 820. Gate dielectric 820 may correspond to layer 442 described above and/or may include one or more additional layers of plug 304. As described above, forming conductive material portions 812, which may include metal, allows gate dielectric 820 to include a high-k dielectric material that contacts conductive material portions 812, which may provide certain benefits in the operation of the 3D NAND memory array. During programming, electrons can be trapped in gate dielectric 820. The trapped electrons raise the turn ON voltage of the nonvolatile transistor. Transistors with electrons trapped in gate dielectric 820 store logic state "1" whereas transistors without trapped electrons store logic state "0". These logic states are retained for 10 years or more even when the 3D NAND memory is not connected to a power supply. In certain embodiments, the transistors may be SONOS transistors. In other embodiments, the transistors may be TANOS transistors. Other types of transistors also are contemplated.

Multiple transistors are stacked one on top of another in the word line stack. The metal gate (wordline 806) of one transistor is isolated from other nonvolatile transistors stacked above and below by layers of dielectric material 808. The transistors of the stack share a common source terminal 822 and also share a common drain terminal 824. A thin layer of lightly doped silicon layer 826, e.g., doped between $10^{14}$ cm$^{-3}$ to $10^{17}$ cm$^{-3}$, forms the channels 816 for the stacked transistors in the 3D NAND memory array. The thin layer of lightly doped silicon layer 826 may correspond to layer 448 described above. The thin layer of lightly doped silicon layer 826 may be in-situ doped with an n-type dopant to form an n-channel transistor. One end of the thin layer of lightly doped silicon layer 826 is shorted to common source bitline 814 that is while the opposite end of the thin layer of lightly doped silicon layer 826 is shorted to common drain bitline 804.

During operation a voltage can be applied to common drain bitline 804 (drain terminal 824) with common source bitline 814 (source terminal 822) held at ground. Voltage on a gate terminal 828 can be connected to one of the gates (wordline 806) by turning one of gate select transistors 830 ON. If the transistor is programmed with a zero (no trapped electrons), channel 816 will turn ON and additional current flows through the channel 816 of the transistor. If, however, the transistor is programmed with a one (trapped electrons), channel 816 will remain OFF and no additional current flows.

Embodiments of this disclosure may provide one or more technical advantages. In certain embodiments, replacing one or more portions of a polysilicon layer (e.g., polysilicon layer 106) with a conductive material (e.g., conductive material 432) that has a lower resistivity than polysilicon may improve device performance. For example, in an embodiment in which the polysilicon layers (e.g., polysilicon layers 106) in a multilayer stack (e.g., multilayer stack 102) are configured to operate as gates in a 3D NAND or other 3D structure, replacing at least a portion of the polysilicon material with a lower resistivity material may improve gate performance, such as by improving current flow and/or providing faster switching times. In certain embodiments, replacing the portion of the polysilicon layers at the edge of a hole (e.g., a channel hole) formed through the multilayer stack with a metal conductive material (e.g., TiN, TiSiN, TaN, TiAlC, TiON, TiCN, or TiAlN) may allow a high-k dielectric material (e.g., AlO, such as Al$_2$O$_3$) to be used as an initial layer along sidewalls 704 of holes 104. The high-k dielectric may serve as a gate dielectric for a 3D structure (e.g., a 3D NAND device). This capability may allow an OPOP stack to be combined with a high-k gate dielectric, possibly resulting in TANOS device rather than a SONOS device.

Embodiments of this disclosure may provide some none or all of these technical advantages. Furthermore, these and other technical advantages may be readily apparent to one of ordinary skill in the art based on this description.

Reference throughout this specification to "one embodiment," "an embodiment," "certain embodiments," or the like means that a particular feature, structure, material, or characteristic described in connection with the embodiment is included in at least one embodiment of this disclosure, but do not denote that they are present in every embodiment. Thus, the appearances of the phrases "in one embodiment," "in an embodiment," "in certain embodiments," or the like in various places throughout this specification are not necessarily referring to the same embodiment of this disclosure. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with this disclosure. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, may include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate including a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of this disclosure. Similarly, for purposes of explanation, specific numbers, materials, and configurations are set forth in order to provide a thorough understanding of this disclosure. Nevertheless, this disclosure may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although aspects of this disclosure are described with reference to specific embodiments, various modifications and changes can be made without departing from the scope of this disclosure. Accordingly, the specification and figures are to be regarded in an illustrative rather than a restrictive sense, and such modifications are intended to be included within the scope of this disclosure. Further, any benefits, advantages, or solutions to problems that are described herein with regard to specific embodiments are not intended to be construed as a critical, required, or essential feature or element of any or all the claims.

Although this disclosure describes particular process/method steps as occurring in a particular order, this disclosure contemplates the process steps occurring in any suitable order. While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method for forming three-dimensional (3D) structures for a microelectronic workpiece, comprising:
    forming holes within a multilayer stack, the multilayer stack comprising polysilicon layers separated by other layers;
    forming recesses within the polysilicon layers at edges of the holes;
    depositing a conductive material within the recesses to form outer layers within the holes, wherein the conductive material deposited within the recesses is deposited in direct contact with the polysilicon layers within the recesses and is conductive as initially deposited in direct contact with the polysilicon layers within the recesses, the conductive material deposited within the recesses being an electrically conductive material; and
    forming plugs adjacent to the outer layers within the holes.

2. The method of claim 1, wherein the multilayer stack comprises alternating oxide layers and polysilicon layers.

3. The method of claim 1, wherein the conductive material deposited within the recesses comprises titanium nitride.

4. The method of claim 1, wherein the conductive material deposited within the recesses comprises at least one of titanium silicon nitride (TiSiN), tantalum nitride (TaN), aluminum-doped titanium carbide (TiAlC), titanium oxynitride (TiON), titanium carbon nitride (TiCN), or titanium aluminum nitride (TiAlN).

5. The method of claim 1, wherein:
    the holes comprise channel holes for three-dimensional memory cells; and
    the polysilicon layers and the conductive material within the recesses are used to provide gates for the three-dimensional memory cells.

6. The method of claim 5, wherein the three-dimensional memory cells comprise vertical NAND memory cells.

7. The method of claim 1, wherein the plugs comprise one or more of the following film layers: aluminum oxide layers, silicon nitride layers, oxide layers, or silicon layers.

8. The method of claim 1, wherein forming the recesses comprises performing one or more wet etch processes, plasma etch processes, reactive ion etch processes, or combinations of etch processes.

9. The method of claim 1, wherein depositing the conductive material within the recesses comprises performing one or more atomic layer deposition processes, chemical vapor deposition processes, plasma deposition processes, or combinations of deposition processes.

10. The method of claim 1, wherein a target level of resistivity is achieved across the structures by depositing the conductive material within the recesses formed in the polysilicon layers.

11. A method of forming three-dimensional (3D) structures for a microelectronic workpiece, comprising:
    forming, over a substrate, a multilayer stack that comprises polysilicon layers and insulating layers in an alternating stacked arrangement;
    forming channel holes for 3D memory cells, the channel holes being formed within the multilayer stack and extending into the substrate;
    forming outer layers within the channel holes, the outer layers comprising fill material deposited within recesses that are formed within the polysilicon layers at edges of the channel holes and within substrate recesses that are formed within the substrate in the channel holes, the fill material having a lower resistivity than the polysilicon layers, the polysilicon layers and the fill material within the recesses configured to provide gates for the 3D memory cells, wherein the fill material deposited within the recesses directly contacts the polysilicon layers within the recesses and has the lower resistivity as initially deposited; and
    forming plugs adjacent the outer layers within the channel holes, the plugs comprising multiple material layers, the multiple material layers for the plugs comprising silicon layers configured to provide channels for the 3D memory cells, at least a portion of the fill material in the substrate recesses remaining between the plugs and the substrate and contacting the plugs after forming the plugs adjacent the outer layers within the channel holes.

12. The method of claim 11, wherein the insulating layers are oxide layers such that the multilayer stack is an oxide-polysilicon-oxide-polysilicon (OPOP) stack.

13. The method of claim 11, wherein the fill material deposited within the recesses comprises titanium nitride.

14. The method of claim 11, wherein the fill material deposited within the recesses comprises at least one of titanium silicon nitride (TiSiN), tantalum nitride (TaN), aluminum-doped titanium carbide (TiAlC), titanium oxynitride (TiON), titanium carbon nitride (TiCN), or titanium aluminum nitride (TiAlN).

15. The method of claim 11, wherein the multiple material layers for the plugs comprise a dielectric layer comprising a low-k dielectric material.

16. The method of claim 11, wherein the 3D memory cells comprise vertical NAND memory cells.

17. The method of claim 11, wherein the recesses are formed at least in part by performing one or more wet etch processes, plasma etch processes, reactive ion etch processes, or combinations of etch processes.

18. The method of claim 11, wherein the fill material is deposited within the recesses at least in part by performing one or more atomic layer deposition processes, chemical vapor deposition processes, plasma deposition processes, or combinations of deposition processes.

19. The method of claim 11, wherein a target level of resistivity is achieved across the structures by depositing the fill material within the recesses formed in the polysilicon layers.

20. A method of forming three-dimensional (3D) structures for a microelectronic workpiece, comprising:

forming a multilayer stack that comprises alternating oxide layers and polysilicon layers;

forming holes within the multilayer stack;

forming recesses within the polysilicon layers at edges of the holes;

depositing conductive material within the recesses to form outer layers within the holes, wherein the conductive material deposited within the recesses is deposited in direct contact with the polysilicon layers within the recesses and is conductive as initially deposited in direct contact with the polysilicon layers within the recesses, the conductive material deposited within the recesses comprising metal and being an electrically conductive material; and forming plugs adjacent to the outer layers within the holes; and providing a 3D memory structure in which remaining portions of the polysilicon layers and the conductive material within the recesses and deposited directly on the polysilicon layers within the recesses provide gates, and in which at least a portion of the plugs provide act as channels.

* * * * *